US008466832B2

(12) United States Patent
Afshari et al.

(10) Patent No.: US 8,466,832 B2
(45) Date of Patent: Jun. 18, 2013

(54) DOPPLER-INSPIRED, HIGH-FREQUENCY SIGNAL GENERATION AND UP-CONVERSION

(75) Inventors: Ehsan Afshari, Newfield, NY (US); Omeed Momeni, Ithaca, NY (US)

(73) Assignee: Cornell University, Ithaca, NY (US)

( * ) Notice: Subject to any disclaimer, the term of this patent is extended or adjusted under 35 U.S.C. 154(b) by 288 days.

(21) Appl. No.: 12/892,210

(22) Filed: Sep. 28, 2010

(65) Prior Publication Data

US 2012/0075034 A1  Mar. 29, 2012

(51) Int. Cl.
G06G 7/12 (2006.01)
(52) U.S. Cl.
USPC ............. 342/175; 331/101; 327/355; 342/22; 342/70; 342/192; 342/196
(58) Field of Classification Search
USPC 342/175, 70, 22, 192, 196; 331/101; 327/355
See application file for complete search history.

(56) References Cited

U.S. PATENT DOCUMENTS

| 5,570,093 | A  | * | 10/1996 | Aker et al. | 342/104 |
|---|---|---|---|---|---|
| 5,815,052 | A  | * | 9/1998 | Nakajima et al. | 333/175 |
| 7,295,154 | B2 | * | 11/2007 | Walton et al. | 342/194 |
| 2006/0022866 | A1 | * | 2/2006 | Walton et al. | 342/194 |
| 2009/0096554 | A1 | * | 4/2009 | Afshari et al. | 333/236 |
| 2011/0194324 | A1 | * | 8/2011 | Afshari et al. | 363/159 |
| 2012/0075034 | A1 | * | 3/2012 | Afshari et al. | 333/101 |

FOREIGN PATENT DOCUMENTS

WO   WO 2009143158 A1 * 11/2009
WO   WO 2009146242 A1 * 12/2009

OTHER PUBLICATIONS

Huang, D., et al., "Terahertz CMOS Frequency Generator Using Linear Superposition Technique," IEEE Journal of Solid-State Circuits, Dec. 2008, vol. 43, No. 12, pp. 2730-2738.
Mohamed, C., et al., "A 1-20-GHz Broadband MMIC Demodulator for Low IF Receivers in Multistandard Applications," IEEE Transactions of Microwave Theory and Technologies, Oct. 2009, vol. 57, No. 10, pp. 2318-2328.
Xu, H., et al., "Nonohmic Contact Planar Varactor Frequency Upconverters for Terahertz Applications," IEEE Transactions of Microwave Theory and Technologies, Apr. 2007, vol. 55, No. 4, pp. 648-655.
Yang, H.-Y., et al., "Design and Analysis of a 0.8-77.5-GHz Ultra-Broadband Distributed Drain Mixer Using 0.13-um CMOS Technology," IEEE Transactions of Microwave Theory and Technologies, Mar. 2009, vol. 57, No. 3, pp. 562-572.
Mao, C., et al., "125-GHz Diode Frequency Doubler in 0.13-um CMOS," IEEE Journal of Solid-State Circuits, May 2009, vol. 44, No. 5, pp. 1531-1538.
Cao, C., et al., "192 GHz push-push VCO in 0.13 um CMOS," Electronics Letters, Feb. 2006, vol. 42, No. 4.

(Continued)

*Primary Examiner* — John B Sotomayor
(74) *Attorney, Agent, or Firm* — Saliwanchik, Lloyd & Eisenschenk

(57) ABSTRACT

Doppler-inspired methods for signal generation and frequency up-conversion are provided that are compatible with CMOS technology. In accordance with an embodiment, a circuit is provided that includes two input signals that can propagate on artificial transmission lines in opposite directions, resembling the relative movement of source and observer in Doppler frequency shift; and an output signal combiner. By controlling the characteristics of the transmission lines and the input signal frequencies, the harmonic generation of active devices is utilized and combined to provide the desired high-frequency component at the output.

21 Claims, 14 Drawing Sheets

OTHER PUBLICATIONS

Seok, E., et al. "A 410 GHz CMOS Push-Push Oscillator with an On-Chip Patch Antenna," IEEE International Solid-State Circuits Conference, Feb. 6, 2008.

Afshari, E., "Signal Generation and Processing Beyond Transistor Limits," Seminar Series Spring 2010, UMass Amhurst, Apr. 23, 2010.

* cited by examiner

DOPPLER-INSPIRED, HIGH-FREQUENCY SIGNAL GENERATION AND UP-CONVERSION

This invention was made with government funds under Contract No. HR0011-07-3-0002 awarded by DARPA. The U.S. Government has rights in this invention.

BACKGROUND OF THE INVENTION

There is growing interest in signal generation in the millimeter-wave and terahertz frequency ranges. There are numerous applications for mm-wave frequencies such as broadband wireless access (e.g., WiMax), vehicular radars, short-range communications, and ultra-narrow pulse generation for ultra-wideband (UWB) radar. Bio- and molecular spectroscopy were the first and the main applications for the terahertz band, which is usually defined to be between 300 GHz and 3 THz. Recently, this range has also been used for imaging, compact range radars, and remote sensing.

Signal generation at these frequencies is a major challenge in solid-state electronics due to the limited efficiency and breakdown voltage of active devices, as well as the lower quality factor of passive components caused by ohmic and substrate loss. Currently, because of the advances in solid-state technology, it is possible to generate hundreds of milliwatts of power at around 100 GHz and below using GaAs and InP heterojunction bipolar transistor (HBT) power amplifiers and high electron mobility transistor (HEMT) power amplifiers. Fundamental oscillation using Gunn diodes, impact ionization avalanche transit-time (IMPATT) diodes, and tunneling transit-time (TUNNETT) diodes, and more recently, silicon-based power amplification, result in high output power for the same frequency band (around 100 GHz). However, above 150 GHz, frequency multipliers presently surpass all other solid-state sources in terms of output power, and quantum cascade lasers with cryogenic cooling dominate for frequencies above 2 THz. Consequently, frequency multipliers are used to cover signal generation for a major part of the terahertz band.

Schottky barrier diodes are the main components of the terahertz frequency multipliers. Schottky barrier diodes are also used in terahertz sub-harmonic up/down converters. In addition, scaling of the CMOS process has resulted in higher transistor cut-off frequency, resulting in the recent inclusion of CMOS transistors in terahertz multipliers in the form of harmonic oscillators. Although frequency multipliers have the highest output power compared with other solid-state components in the terahertz band, frequency multipliers tend to generate lower power relative to other signal sources that are used in higher (>3 THz) and lower (<150 GHz) frequency regions. This is referred to as the "terahertz gap," and is a result of a fundamental trade-off between series resistance and capacitance of the nonlinear device.

One approach to achieving higher power levels for the frequency multipliers is to employ multiple devices and then combine their output powers. Unfortunately, matching considerations, as well as the effect of propagation delay, limit the number of devices that can be combined using existing power-combining techniques. To address this issue, spatial power-combining techniques such as quasi-optical arrays have been used to achieve high powers in terahertz frequencies. However, quasi-optical arrays require antenna arrays, which makes this technique bulky and cost inefficient. Furthermore, generating a guided terahertz signal using this technique is challenging.

Accordingly, there continues to be a need for high frequency signal generation circuits in the millimeter and terahertz frequency bands capable of achieving high powers. In addition, cost and size considerations continue to be factors in high frequency generation.

BRIEF SUMMARY OF THE INVENTION

Embodiments of the present invention provide methods of generating and combining high-frequency signals and devices utilizing the same. According to certain embodiments, a Doppler effect-inspired technique is used in frequency multipliers and sub-harmonic up-converter mixers.

In one embodiment, two input signals propagate on artificial transmission lines in opposite directions, which resembles the relative movement of the source and observer in Doppler frequency shift. These two signals excite a series of nonlinear devices that can generate higher-frequency outputs. By controlling the characteristics of the transmission lines and the signal frequencies, a desired high-frequency component is combined at the output. Because the input signals are propagating through transmission lines, the circuit is relatively wide-band if the output matching is broadband. The subject technique can be implemented using any nonlinear devices such as Schottky diodes, III-V HBT/HEMT, and CMOS transistors.

DETAILED DISCLOSURE OF THE INVENTION

Embodiments of the present invention provide circuits and methods for achieving high-frequency signal generation from a lower frequency input. According to one embodiment, an up-converter mixer is provided. Accordingly to another embodiment, a frequency multiplier circuit is provided. Advantageously, the subject circuits can be implemented using any nonlinear devices such as Schottky diodes, III-V HBT/HEMT, and CMOS (NMOS and/or PMOS) transistors.

For embodiments implemented using conventional CMOS processes, easy integration into CMOS devices can be accomplished.

An embodiment of the present invention utilizes the Doppler effect to generate a higher frequency output from a lower frequency input.

The Doppler effect, named after Christian Doppler who introduced the effect in 1842, refers to the proposition that if an observer and a source of a wave move relative to each other, the wave frequency sensed by the observer is different from the wave frequency at the source. Equation 1 shows the relationship between the observed frequency $f_o$ and the source frequency $f_s$ of the wave.

$$f_O = f_S \left( \frac{v_w \pm v_O}{v_w \mp v_S} \right). \tag{1}$$

Here, $v_w$ is the velocity of the wave in the medium, $v_s$ is the velocity of the source, and $v_o$ is the velocity of the observer. For equation 1, the positive sign is used in the numerator if the observer is moving toward the source, and the negative sign is used in the numerator if the observer is moving away from the source. The negative sign is used in the denominator if the source is moving toward the observer, and the positive sign is used in the denominator if the source is moving away from the observer. Therefore, if the net moving of the observer and the source is toward each other, then the observer senses a higher wave frequency than the source.

Accordingly, with a low-frequency wave source and a moving observer, a high-frequency wave can be generated for the observer. In the electric domain, an equivalent circuit is provided using an electrical signal to represent the wave and a transmission line or waveguide to represent the propagation medium. Thus, in accordance with one embodiment of the invention, two input signals propagate on artificial transmission lines in opposite directions, resembling the relative movement of the source and observer in Doppler frequency shift. These two signals excite a series of nonlinear devices that can generate higher-frequency outputs. By controlling the characteristics of the transmission lines and the signal frequencies, a desired high-frequency component is combined at the output.

Figure 1:
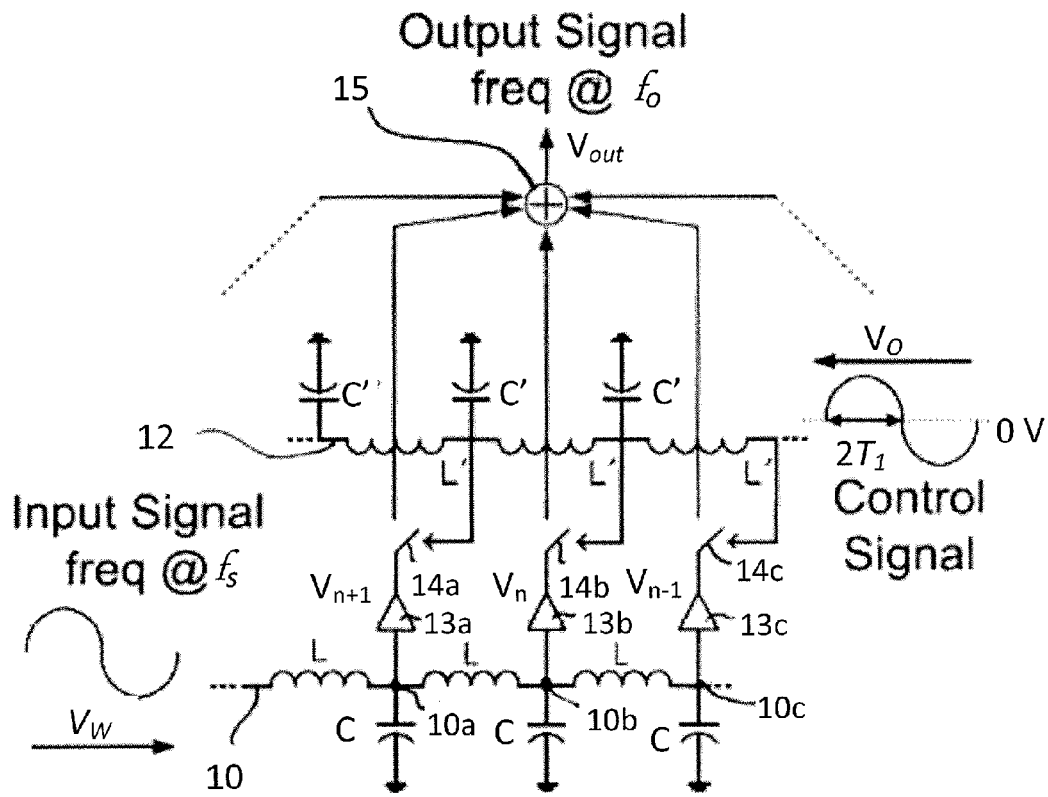
FIG. 1 shows a block diagram of Doppler-inspired high-frequency signal generation in accordance with an embodiment of the invention.

FIG. 1 shows a block diagram example of incorporating the Doppler effect to generate high-frequency signal in the electrical domain in accordance with an embodiment of the present invention. Referring to FIG. 1, a first transmission line 10 is represented in the equivalent circuit diagram by identical inductors L connected in series and identical capacitors C shunt-connected at each node. The first transmission line 10 is the medium for the wave at the source (i.e. input signal) to propagate. A second transmission line 12 is represented in the equivalent circuit diagram by identical inductors L' connected in series and identical capacitors C' shunt-connected at each node. The second transmission line 12 is the medium of the moving observer.

For the diagram shown in FIG. 1, the wave source is stationary ($v_s=0$), and the observer is moving toward the source ($v_o$ is positive and represented as a traveling control signal). The signal traveling in the first transmission line 10 (at velocity $v_w$) is buffered and connected to a switch at each node of the first transmission line 10. Three nodes 10a, 10b, and 10c are shown in FIG. 1. A first buffer 13a is connected between a first switch 14a and node 10a, a second buffer 13b is connected between a first switch 14b and node 10b, and a third buffer 13c is connected between a first switch 14c and node 10c. If the switches 14a, 14b, and 14c are assumed to be ideal, then a switch is considered "on" as long as a positive signal is applied. The traveling control signal in the second transmission line 12 enables (i.e. turns "on") each switch as it moves toward the signal source, thereby sending a sample of the signal wave traveling from the source to the signal combiner 15.

This electronic domain implementation resembles an observer who is moving toward a wave source and is receiving the wave in a discrete fashion (a discrete version of the Doppler effect).

To calculate the frequency components and the amplitude of the output signal at the signal combiner 15, the input signal is assumed to be a sinusoidal wave. Accordingly, the voltage at the n-th node of the first transmission line 10 is given as Equation 2.

$$V_n(t) = A \exp[i(\omega_s t \pm k_s n)], \tag{2}$$

where $\omega_s$ is the signal angular frequency at the source, $k_s$ is the phase shift per section in the first transmission line 10, A is the signal amplitude, and n is a positive integer number that corresponds to the node number in both transmission lines. The positive sign is used in Equation 2 for the case where the observer moves toward the source, and the negative sign is used for the case where the observer is moving away from the source.

As the control signal moves along the second transmission line 12, the control signal turns on the switches 14c, 14b, and 14a, thereby sequentially connecting a node (e.g., 10c, 10b, and 10a) of the first transmission line 10 to the signal combiner 15. The switching function, which is an ideal pulse function (using the assumption that the switches are ideal), is multiplied by the signal at each node in the first transmission line 10. For this analysis, both transmission lines are assumed to have N sections and that the control signal arrives at node n=1 at t=0. The output voltage $V_{out}(t)$ at the signal combiner 15 can then be calculated using Equation 3.

$$V_{out}(t) = A\exp(i\omega_s t)\sum_{n=1}^{N} s(t - T_1 - (n-1)t_d)\exp(\pm ik_s n), \quad (3)$$

where $t_d$ is the time delay per section in the second transmission line 12, $2T_1$ is the switching pulse width, and in which the switching function s(t) for the ideal switches is provided as follows.

$$s(t) = \begin{cases} 1 & \text{if } |t| \leq T_1 \\ 0 & \text{if } |t| > T_1 \end{cases} \quad (4)$$

In a real circuit, the switches are not ideal and do not have a perfect square-pulse response. For these non-ideal switches, a real switching function can be substituted for Relation 4 in the above expression, and the following analysis is still valid.

The frequency components of the output signal can be found by using a Fourier transform determined using Equation 5.

$$V_{out}(\omega) = \frac{2A\sin[(\omega - \omega_s)T_1]}{\omega - \omega_s} \times \sum_{n=1}^{N} \exp[i(-(\omega - \omega_s)T_1 - (n-1)(\omega - \omega_s)t_d \pm k_s n)]. \quad (5)$$

The output spectrum consists of the addition of multiple Sin c functions with different phases. To have the maximum amplitude for a certain frequency component (e.g., $\omega_o$), the Sin c functions should add up in-phase at that frequency. This phase condition implies that at frequency $\omega_o$ and for every n, the phase of the n-th Sin c function should be equal to the phase of the n+1-th Sin c function plus a multiple integer of $2\pi$. Applying this condition, n can be eliminated and Equation 6 can be obtained as follows:

$$-(n-1)(\omega_o - \omega_s)t_d \pm k_s n = -(n)(\omega_o - \omega_s)t_d \pm k_s(n+1) + 2m\pi, \quad (6)$$

$$\Rightarrow (\omega_o - \omega_s)t_d = 2m\pi \pm k_s,$$

in which in is an integer number. If the frequencies of the input signal ($\omega_s$) and the control signal ($\omega_c$) are much less than the cut-off frequencies of the first and second transmission lines, respectively, $$\omega_s \ll \frac{2}{\sqrt{LC}}, \omega_c \ll \frac{2}{\sqrt{L'C'}}, \quad (7)$$

then $t_d$ and $k_s$ can be found to be $$t_d = \sqrt{L'C'}, k_s = \omega_s\sqrt{LC}. \quad (8)$$

Then, by substituting Equation 8 in Equation 6, the output signal frequencies that add in-phase from all branches can be found as follows:

$$f_o = f_s\left(1 \pm \frac{\sqrt{LC}}{\sqrt{L'C'}}\right) + \frac{m}{\sqrt{L'C'}} = f_s\left(1 \pm \frac{v_o}{v_w}\right) + mv_o. \quad (9)$$

By comparing Equation 9 with Equation 1 for the case that the wave source is not moving, the equations are same when $mv_o=0$. The expression $mv_o$ comes from using a discrete Doppler model. In the limit that the model becomes a continuous system, m also goes to zero, and hence the two expressions of the observed frequency $f_o$ in Equation 9 and Equation 1 become equal. Equation 9 verifies that if the observer moves toward the signal source (e.g., by using the positive sign in Equation 9), it is possible to have a higher frequency in the output than the one in the input.

Figure 2:
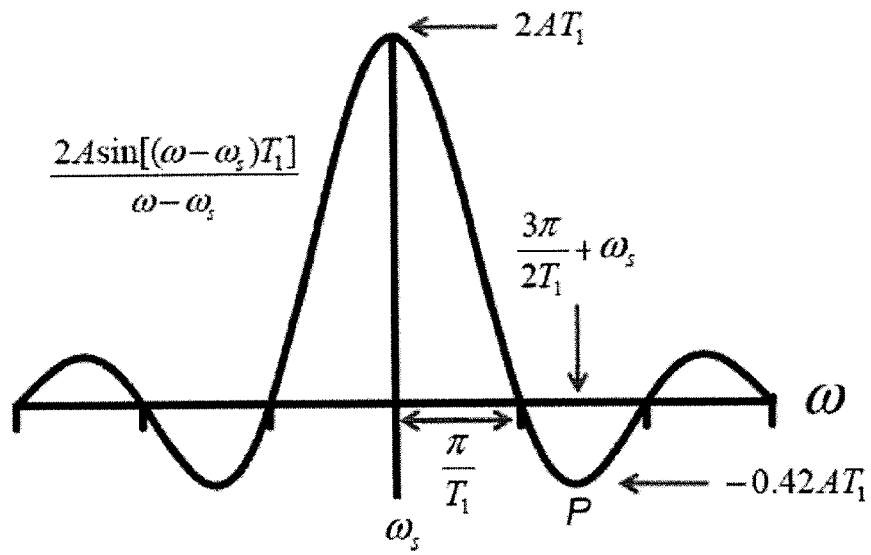
FIG. 2 is a plot of the magnitude of an individual Sin c function for the Fourier transform of the output signal of the representational circuit shown in FIG. 1.

The expression of Equation 9 is a phase condition and does not provide information about the magnitude of the output signal. Accordingly, FIG. 2 shows the magnitude of an individual Sine function in frequency components of the output signal found using Equation 5. If the output signal frequency ($\omega_o$) satisfies Equation 9, assuming an ideal voltage adder, the output signal amplitude becomes $$V_{out}(\omega_o) = N\frac{2A\sin[(\omega_o - \omega_s)T_1]}{\omega_o - \omega_s}. \quad (10)$$

It is clear from FIG. 2 and Equation 10 that, for a fixed $T_1$, a choice of a higher or lower output frequency than $\omega_s$ leads to a lower output signal power.

The output signal frequency and amplitude for any input signal of the circuit of FIG. 1 can be determined using Equations 7, 9, and 10.

The above analysis is for only one period of the control signal. However, in an actual implementation, because a continuous output signal is desired, a periodical control waveform can be used. For a periodic control signal, the output spectrum of each branch is not a continuous Sin c function anymore. Instead, the output spectrum of each branch consists of a train of impulses, the amplitude of which follow the same Sine function shown in FIG. 2. The impulse functions are spaced by the control signal frequency ($\omega_c$), which limits the output frequencies to Equation 11.

$$\omega_o = \omega_s \pm l\omega_c, \quad (11)$$

where l is an integer number. A frequency can be selected from Equation 11, and the transmission lines can be designed using Equation 9 in order to constructively add the chosen frequency component from all the branches. In FIG. 1, the switching threshold voltage is assumed to be zero. For a sinusoidal control signal with a zero DC bias, the switching function has a 50% duty cycle and the control frequency can be written as $$\omega_c = \frac{2\pi}{4T_1}.$$

By changing the DC bias of the control signal, the control signal period ($T_c$) can be decoupled from the pulse width ($2T_1$). Accordingly, the output signal amplitude can be modified by changing the pulse width (by changing the DC bias) while maintaining a fixed output frequency (e.g., by fixing the control signal period ($T_c$)).

EXAMPLE 1 selecting output frequency $\omega_o=4\omega_s$ and using sinusoidal control signal with a zero DC bias.

For an output frequency at $\omega_o=4\omega_s$ and using a sinusoidal control signal with a zero DC bias $$\left(\omega_c = \frac{2\pi}{4T_1}\right),$$

$\omega_o$ can be located anywhere on the curve of FIG. 2 that satisfies Equation 11. From Equation 11, the control signal frequency $\omega_c$ can be as follows.

$$\omega_c = \frac{3\omega_s}{l}. \tag{12}$$

There is a trade-off between $\omega_c$ and the amplitude of the output signal because if $\omega_o$ is close to the peak in FIG. 2 (e.g., l=1), the output will have high amplitude but $\omega_c$ would also be high (e.g., $\omega_c=3\omega_s$). To address this issue and also have high $\omega_o$ with a high amplitude, $\omega_o$ can be located on the second peak of the Sin c function (point P in FIG. 2). Doing so will result in $\omega_c$ comparable to $\omega_s$, which means that a signal at $4\omega_s$ can be generated using two signals at or around $\omega_s$.

In particular, when $\omega_o$ is located on the second peak $$\left(\omega_o = \frac{3\pi}{2T_1} + \omega_s\right): \frac{3\pi}{2T_1} + \omega_s = 4\omega_s \Longrightarrow \omega_c = \omega_s. \tag{13}$$

This also satisfies Equation 11, and will result in l=3. Any integer number can be chosen for in in Equation 9, but for simplicity m=0 in this specific design. For this design, the "much smaller" in Relation 7 is assumed to be smaller by a factor of 2, and by using Equation 9 (given $\omega_o=4\omega_s$) and Equation 13, the following Equation 14 is obtained.

$$\sqrt{LC} = \frac{2}{2\omega_s}, \sqrt{L'C'} = \frac{2}{3\times 2\omega_s}. \tag{14}$$

In a 50Ω system, $$Z_o = \sqrt{\frac{L}{C}} = \sqrt{\frac{L'}{C'}} = 50 \, \Omega,$$

and therefore by using Equation 14, the values of the inductors and capacitors can be determined as follows.

$$L = \frac{50}{\omega_s}, C = \frac{1}{50\omega_s}, L' = \frac{50}{3\omega_s}, C' = \frac{1}{150\omega_s}. \tag{15}$$

If $f_s=100$ GHz, then the output frequency is at $f_o=400$ GHz. Given these frequencies, the values for the inductors and capacitors can be L=80 pH, C=32 fF, L'=27 pH, C'=11 fF. In today's solid-state processes, these values are easily realizable. According to embodiments, higher or lower component values can be designed by changing the factor in in Equation 9 to positive or negative integers.

To find the output signal amplitude, Equation 10 can be used to arrive at Equation 16:

$$|V_{out}(4\omega_s)| = N \times 0.42A \frac{1}{4f_s}. \tag{16}$$

It is clear from Equation 16 that as the input frequency $f_s$ increases, the output power at $4f_s$ decreases. This is because as $f_s$ increases, the second peak in FIG. 2, which is at $4f_s$, moves further away from $f_s$, and hence its amplitude drops.

A. Sub-Harmonic Up-Converter

According to certain embodiments, the Doppler-inspired diagram of FIG. 1, can be used to implement an up-converter mixer. For the up-converter mixer implementation of an embodiment of the invention, if $\omega_s$ is in baseband and $\omega_c$ is in local oscillator (LO) frequencies, the up-converted output signal can be at frequencies much higher than $\omega_c$. A mixer that takes, as inputs, a baseband signal and an LO signal is commonly known as a sub-harmonic mixer.

A distributed mixer is a sub-harmonic mixer presently used in RF systems. Distributed mixers are commonly known as wide-band mixers. The distributed mixers consist of discrete transmission lines for RF and LO signals to travel. The two signals (RF and LO) get mixed, and the result travels in a third discrete transmission line, which is designed to add the power from all the sections and deliver it to the load. Because of the power-combining method used in distributed mixers, the third transmission line is commonly made using the drain capacitance of a CMOS or HEMT transistor. Due to the output resistance of these transistors, the loss of the capacitors is high and results in a significant loss for the output signal as it travels through the line to the load. This loss is significant especially for high frequency output signals. This is one of the reasons why almost all of the distributed mixers are down-converter mixers. In addition, another limitation of the distributed mixer power combining line (i.e. the third transmission line) is the limited cut-off frequency of the third transmission line. The limited cut-off frequency limits the maximum frequency that can propagate in the third transmission line.

In contrast, according to certain embodiments of the invention, because the outputs of the switches are in-phase at $f_o$, a third transmission line is not required in order to add the right phases to the output of each section to combine them. Hence, the power-combining network in the Doppler-inspired mixer of embodiments of the present invention can be made using a low-loss, continuous transmission line. The continuous transmission line has a higher cut-off frequency, which allows for higher frequencies to propagate at the combined output. However, according to certain embodiments of the invention, the subject mixer has a lower band width compared with the distributed mixer.

Figure 3:
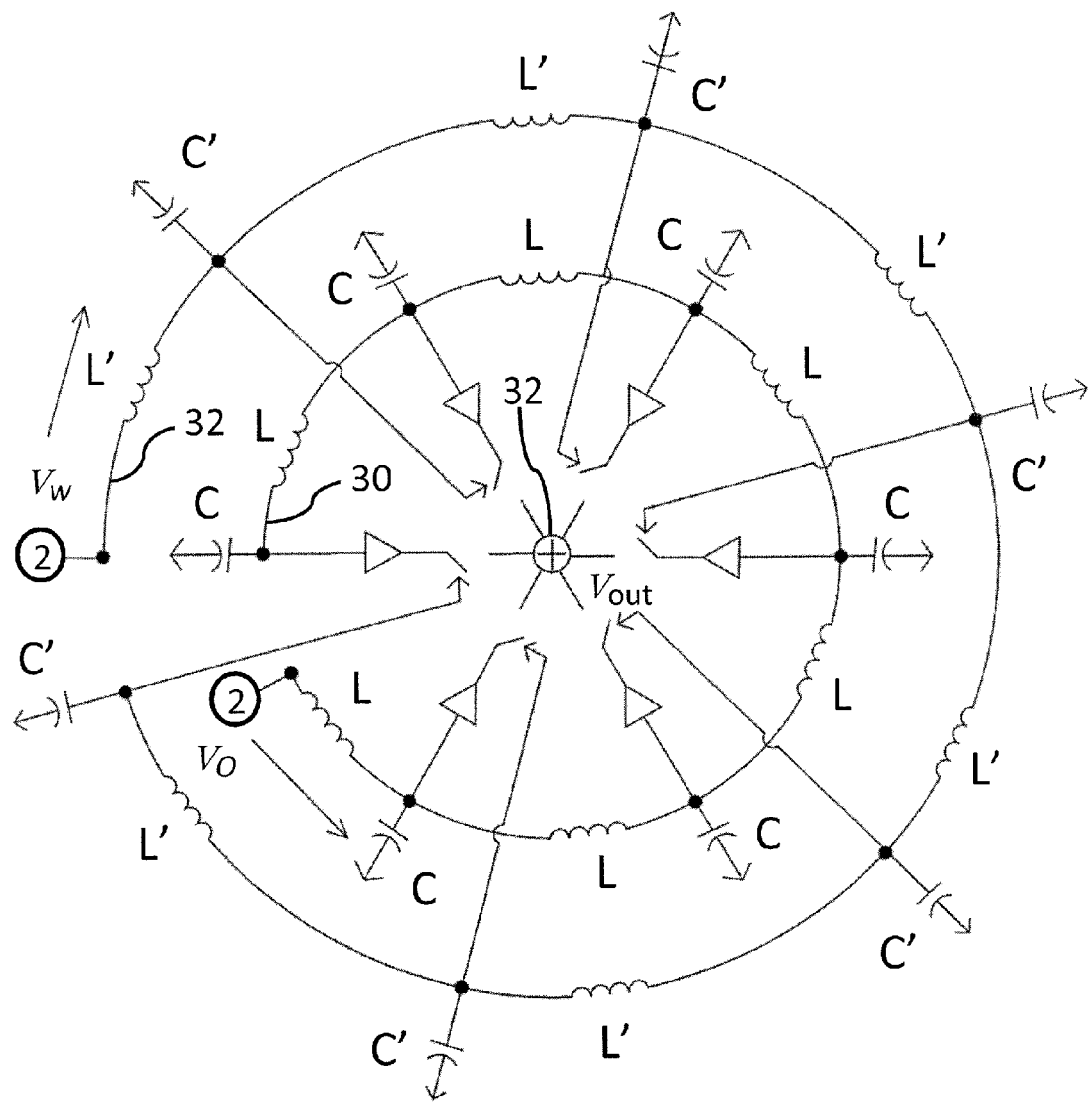
FIG. 3 shows a block diagram of Doppler-inspired mixer in accordance with an embodiment of the invention.

According to one embodiment for very high output frequencies, the subject mixer can be made using two concentric circular transmission lines. For example, as shown in FIG. 3, the first transmission line 30 can be for one input (the "source" wave) and the second transmission line 32 can be for the second input (the "observer" or control wave). The combiner 35 can be at the center of the two concentric circular transmission lines, providing a minimum output signal path length.

Figure 4:
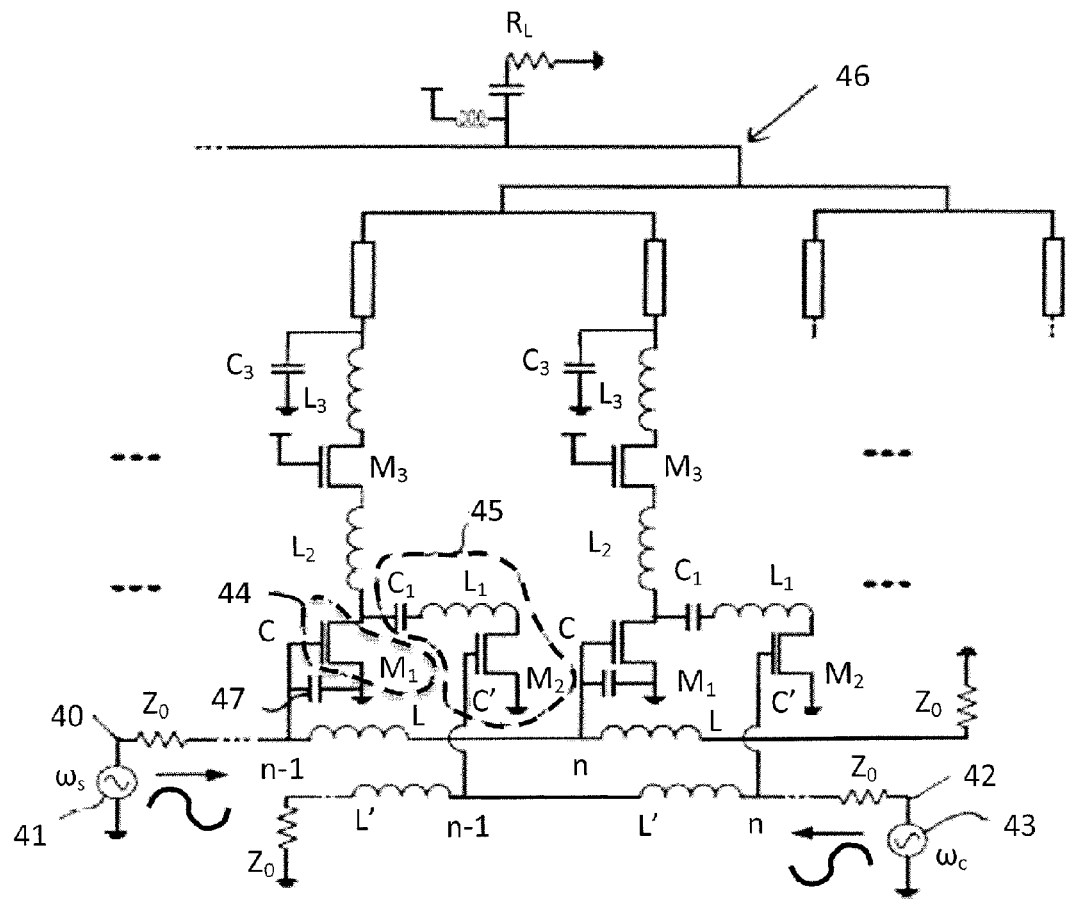
FIG. 4 shows a schematic of a Doppler-inspired, sub-harmonic up-converter according to an embodiment of the invention.

FIG. 4 shows a schematic of an example sub-harmonic up-converter in accordance with an embodiment of the invention. The sub-harmonic up-converter of FIG. 4 was implemented in a 0.13 μm digital CMOS process based on the analysis described above with respect to FIGS. 1 and 2.

In this circuit, $\omega_s$ can be considered the IF frequency and $\omega_c$ can be considered the LO frequency. Similar to FIG. 1, there are two transmission lines to guide the source and control signals in opposite directions. In particular, a first transmission line 40 is connected to the IF input 41 and the second transmission line 42 is connected to the LO input 43. The sub-harmonic up-converter circuit also includes signal buffers, switches, and an output power combiner. In particular, a transistor $M_1$ acts as a buffer 44 to isolate the switch 45 from the source signal transmission line 40. Transistor $M_2$, along with $L_1$ and $C_1$, acts as the switch 45. The inductor $L_1$ and the capacitor $C_1$ are included as part of the switch 45 in order to improve the switching behavior of the transistor $M_2$ and may be omitted or replaced with other elements depending on the particular rising/falling time characteristics needed for the switch 45. The transistor $M_3$ isolates the switching part of the circuit (i.e. 45) from the power combiner 46. Inductors $L_2$ and $L_3$, and capacitor $C_3$ are used for power matching.

EXAMPLE 2 a sub-harmonic up-converter, up-converting a source signal $\omega_s$ to around $4\omega_s$.

Figure 5:
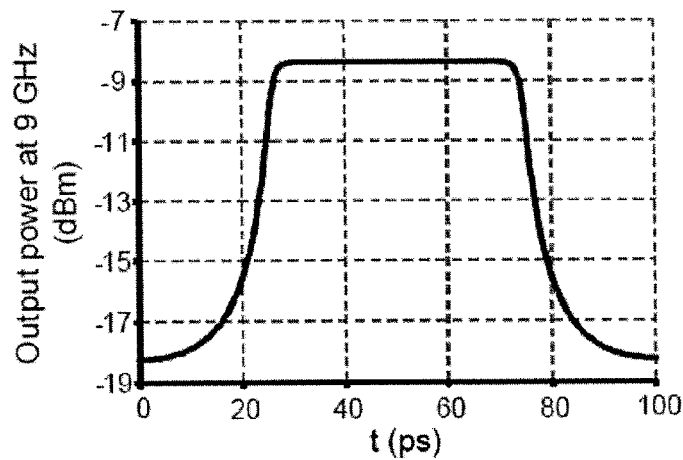
FIG. 5 is a plot of output power over time to illustrate the switching function of the resonant switch M2 of FIG. 4 in accordance with an embodiment of the invention.

A design is implemented to up-convert the source signal to around four times its frequency. To facilitate the measurement and illustrate the concept, the source frequency is selected as $f_s$=9 GHz. Following the analysis presented in Example 1, the output frequency is placed on the second peak (point P) of FIG. 2. In order to distinguish the output signal from the 4th harmonic of the input, the control signal frequency is selected to be $f_c$=10 GHz. Applying these values to Equation 11, results in an output frequency of $3f_c+f_s$=39 GHz, assuming that the switching function is close to the ideal square pulse. To find the response of the switches in FIG. 4, a measurement is obtained of the output power of each section at 9 GHz when the control signal is applied to the gate of $M_2$. FIG. 5 shows a simulation plot of this measurement. When $M_2$ is "on", $L_1$ and $C_1$ along with $M_2$ resonate at $\omega_s$ and create a short path from the drain of $M_1$ to ground. When $M_2$ is "off", its impedance changes and increases the switch impedance compared to its "on" state. In this design, the switch impedance difference is about a factor of ten. FIG. 5 shows the switching function at 9 GHz for a sinusoidal control signal. The power difference in the output between the "on" and "off" states is around 10 dB. The switch response is also very close to a square function because the 10 GHz switching frequency is much lower than the device cutoff frequency. In FIG. 2, the first-to-second peak ratio is 4.7. In comparison, the Fourier transform of the switching function in FIG. 5 reveals the first-to-second peak ratio to be 3.5. This is due to the non-ideal switching function, and it lowers the output power compared with an ideal switch.

Following Example 1, the components for the transmission lines can be selected based on equations 9 and 11. Here, the components for the transmission lines are determined to be: L=800 pH, C=320 fF, L'=235 pH, C'=95 fF. These values were obtained with Equation 15 using $f_s$=10 GHz and rounding.

For the circuit, the maximum current was assumed to be 40 mA, which corresponds to the transistor size for $M_1$ of W=100 μm (L=0.13 μm) and the transistor size for $M_2$ of W=90 μm (L=0.13 μm). Because the size of $M_1$ does not provide 320 fF, an additional capacitor 47, having capacitance of for example 220 fF, is connected in parallel with the gate of $M_1$. In accordance with an embodiment of the invention, the inductors and capacitors are implemented using shielded spiral inductors and vertical natural capacitors, respectively.

The cutoff frequency of the signal line is 20 GHz and the cutoff frequency of the control line is 67 GHz, which easily satisfy the conditions of Relation 7. For an optimum output power and to be able to use the tree structure for power combining 8 sections were selected for the two transmission lines. To facilitate testing, 50Ω was assumed for the signal and control sources as well as the output load: $Z_o=R_L=50\Omega$.

Figure 6:
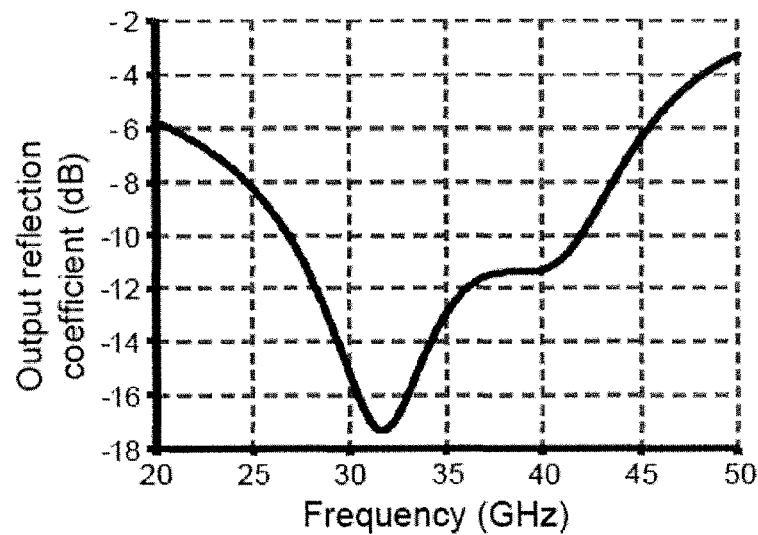
FIG. 6 is a plot of the simulated output reflection coefficient of the up-converter of FIG. 4 in accordance with an embodiment of the invention.

In accordance with an embodiment of the invention, the power combiner is a simple tree structure that was designed using $L_3$, $C_3$, and micro-strip transmission lines to power match and connect all the branches to the load. The output reflection coefficient is shown in FIG. 6. As shown in FIG. 6, a relatively wide band matching was achieved. In particular, from 27 GHz to 42 GHz, the output matching is better than −10 dB, which allows for examination of the circuit performance in a wider range without the limitation of output matching.

During simulations, a 4 dBm source signal at 9 GHz resulted in output power of −30 dBm at 39 GHz. The control signal power was 14 dBm, and the DC current was 40 mA from a 1.5 V power supply. The CMOS process used to simulate and fabricate the circuit shown in FIG. 4 is designed for digital applications and lacks the low-loss thick metals for good performance at high frequencies. Therefore, optimization can be achieved by using different fabrication processes and materials. For example, the simulation of FIG. 4 in an RF 0.13 μm CMOS process shows an output power of up to −16 dBm at 39 GHz (applying a 4 dBm source signal at 9 GHz).

According to certain embodiments, the switching method of FIG. 4 can be modified to realize a sub-harmonic up-converter in higher mm-wave and terahertz frequencies.

EXAMPLE 3

Experimental results for the sub-harmonic up-converter, up-converting a source signal $\omega_s$ to around $4\omega_s$.

Figure 7:
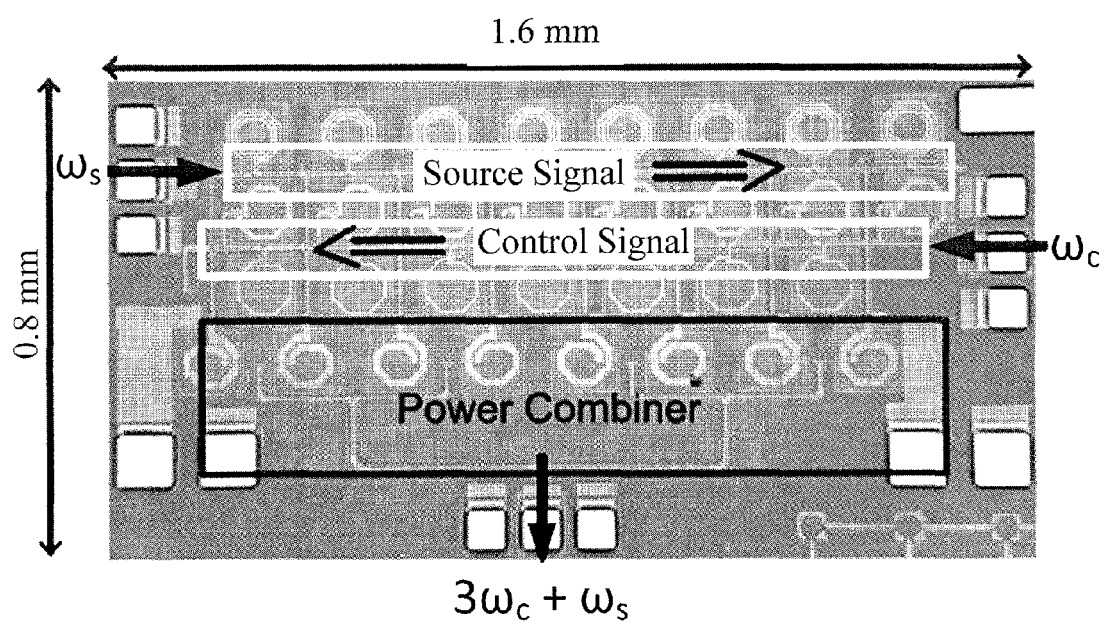
FIG. 7 shows a die photo of a sub-harmonic up-converter according to an embodiment of the invention.
Figure 8:
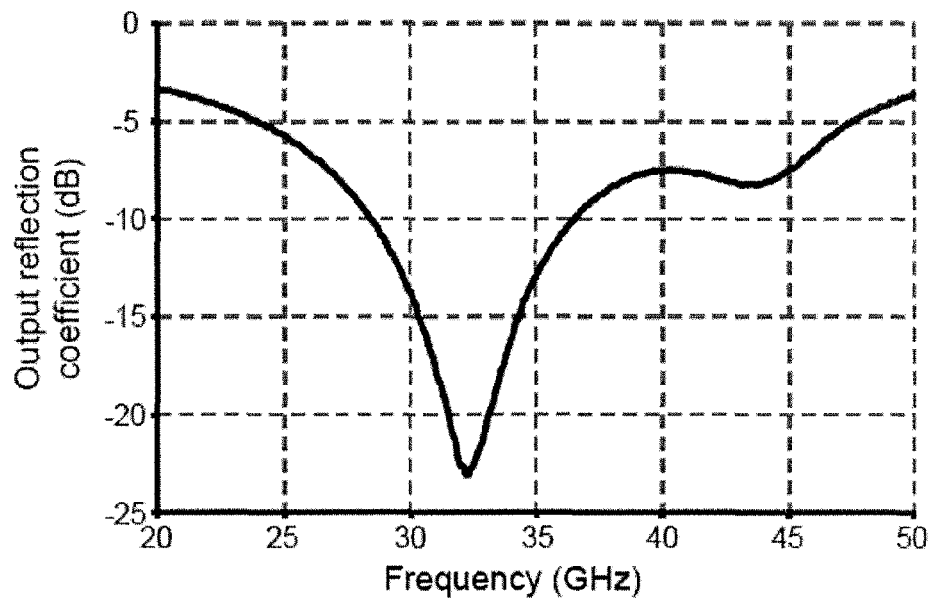
FIG. 8 is a plot of the measured output reflection coefficient of the up-converter of FIG. 7.

The design described in Example 2 was fabricated in a 0.13 μm digital CMOS process. The die photo is shown in FIG. 7. Two external signal sources were used to apply the source signal ($\omega_s$) and the control signal ($\omega_c$) to the circuit through GSG probes. Another GSG probe was used to couple the output ($3\omega_c+\omega_s$) to a spectrum analyzer. Bias tees were used to apply DC biases to all three ports. The measured output reflection coefficient, which closely follows the simulation results of FIG. 6, is shown in the plot of FIG. 8. The small amplitude difference between FIG. 8 and FIG. 6 is due to the inaccurate modeling of inductor loss in the simulation.

Figure 9:
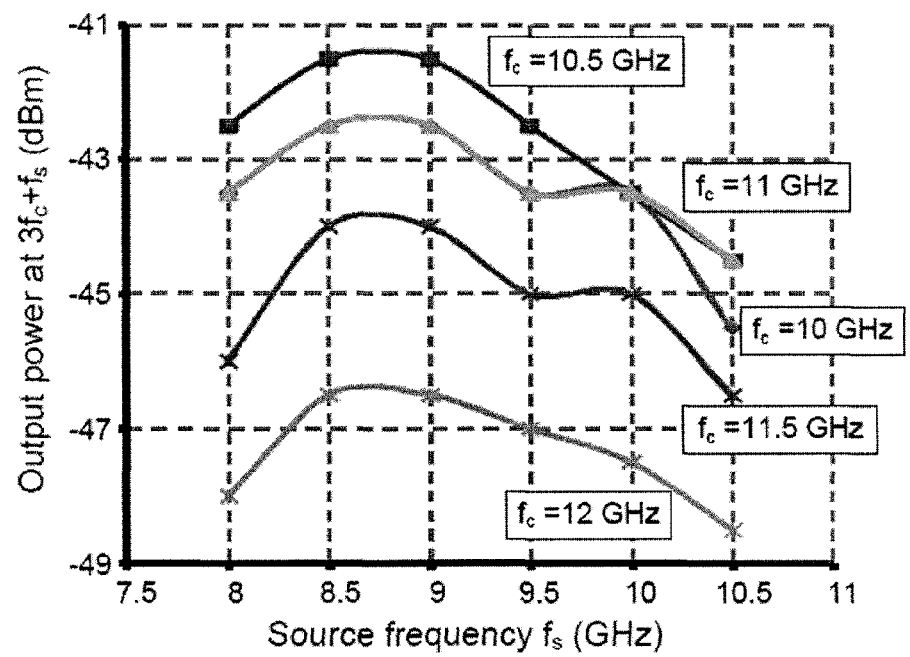
FIG. 9 is a plot of the measured output power at $3f_c+f_s$ for different input frequencies of the up-converter of FIG. 7.

FIG. 9 shows the output power at $3f_c+f_s$ for different source and control input frequencies. The source signal power and the control signal power are −8 dBm and 10 dBm, respectively. The circuit draws 40 mA from a 1.5 V supply voltage. As shown by the results plotted in FIG. 9, for all control frequencies ($f_c$), the output power is maximum at input frequency ($f_s$) of 9 GHz. This result indicates that the switching resonator ($L_1$, $C_1$ and $M_2$ of FIG. 4) actually resonates at 9 GHz when the switch is "on". It is also clear from FIG. 9 that the power reaches its maximum of −41.5 dBm when $f_c$=10.5 GHz and $f_s$=9 GHz. Comparing the values from FIG. 9 to the simulated values $f_c$=10 GHz, $f_s$=9 GHz, and −39.5 dBm for the output power, verifies that the proper in-phase power adding is occurring for these input frequencies. The 2 dB difference of the output power between measurement and simulation is caused by the inaccurate loss models of the inductors and transmission lines and the degraded output reflection coefficient shown in FIG. 8. From Equation 9, the actual LC ratio can be found to be $$\frac{\sqrt{LC}}{\sqrt{L'C'}} = 3:5,$$

which is in good agreement with the simulated value of 3.35.

Figure 10:
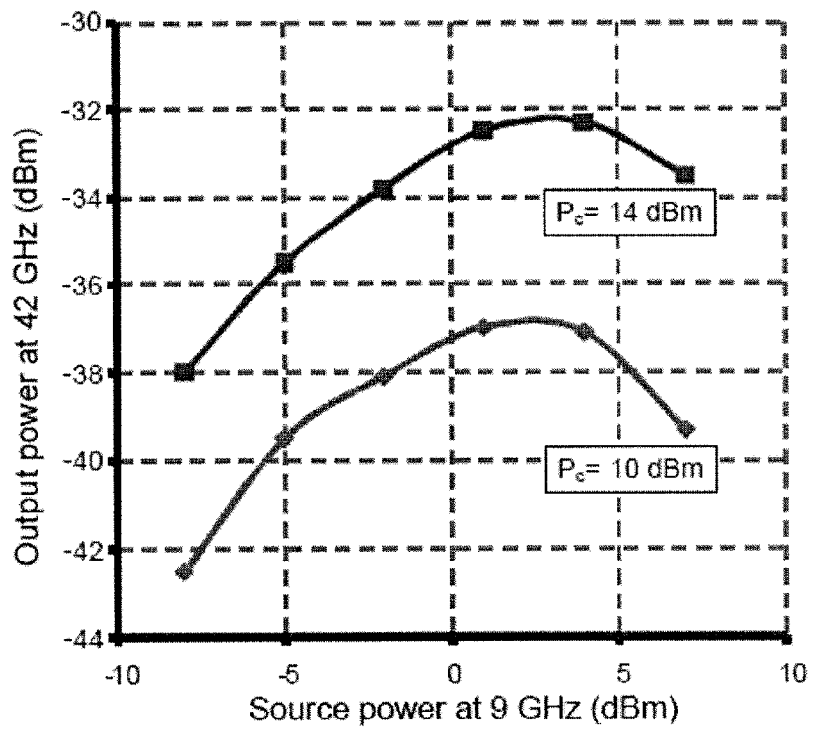
FIG. 10 is a plot of the measured output power of the up-converter of FIG. 7 at 42 GHz vs. source power at 9 GHz and control power ($P_c$) at 11 GHz, comparing $P_c$ at 10 dBm and $P_c$ at 14 dBm.

FIG. 10 shows the output power at 42 GHz as a function of the input source power at 9 GHz and control power ($P_c$) at 11 GHz for $P_c$=10 dBm and $P_c$=14 dBm. As illustrated by FIG. 10, the output power of around −32 dBm is achieved at 42 GHz for a signal power of 4 dBm and a control power of 14 dBm. The higher control power, the harder the switches are driven. This results in a switching response that is closer to the ideal case, increasing the amplitude of the second peak in FIG. 2. Therefore, increasing $P_c$ increases the output power at $3f_c+f_s$. Referring back to Equation 10, it can be seen that a linear relation exists between the source signal amplitude A and the output signal amplitude. Equation 10 was derived using voltage switches and a voltage adder. As indicated by the plot of FIG. 10 for low input powers before the circuit reaches saturation, the same linear relation found in Equation 10 can be obtained between input power and output power by using power switches and a power combiner, as used in the up-converter sub-harmonic mixer of an embodiment of the invention. For this example implementation, the up-converter saturates at the input source power of about 4 dBm.

Accordingly, embodiments of the invention can be used to generate and up-convert high-frequency signals. Although the CMOS process used for the example design is a digital process that lacks thick metals, extension to mm-wave and terahertz frequencies can be accomplished by using high-frequency switches.

B. Terahertz Frequency Multiplier

Frequency multipliers are major components of solid-state terahertz sources. Recently, the nonlinearity of CMOS transistors has also been used to generate terahertz signals. However, the output power of these CMOS oscillators is low compared with GaAs diode multipliers used for solid-state terahertz sources. The CMOS oscillator topology is usually a cross-coupled pair that uses two transistors to generate nonlinearity and adds their power at the second harmonic of the fundamental oscillation frequency. According to an embodiment of the invention, a Doppler inspired CMOS frequency multiplier is provided that utilizes more than two transistors and generates more power than the CMOS oscillator topology.

Figure 11:
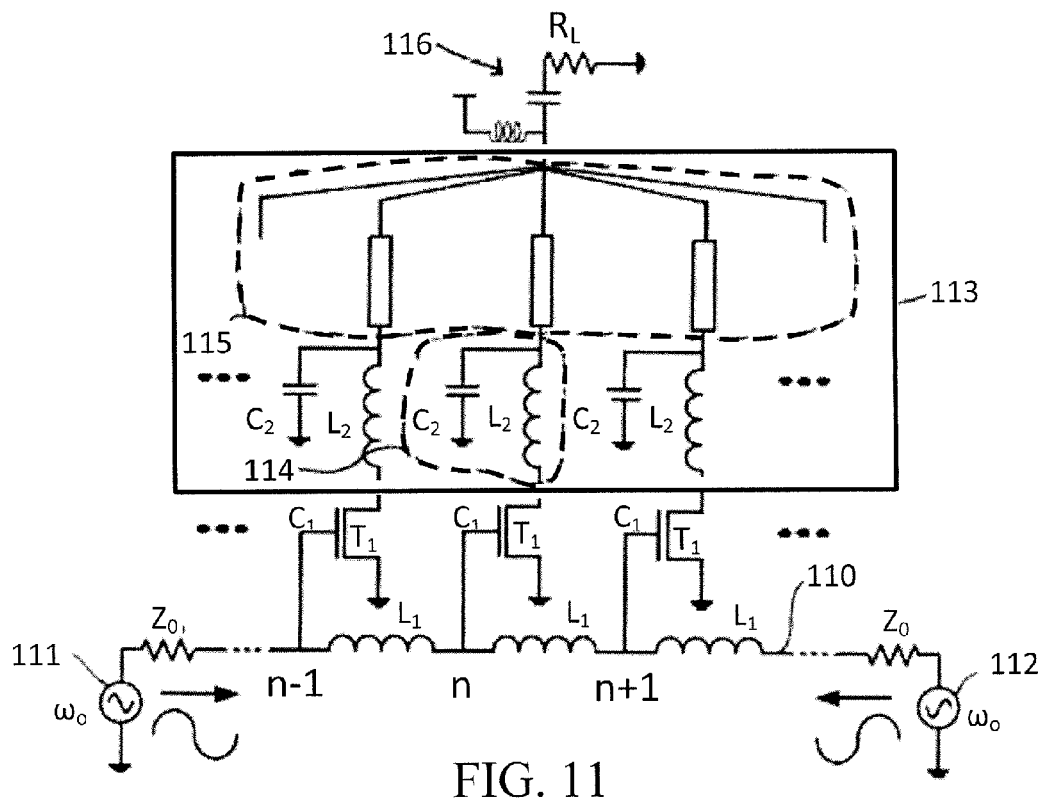
FIG. 11 shows a schematic of a Doppler-inspired frequency multiplier according to an embodiment of the invention.

In accordance with an embodiment of the invention, the Doppler effect can be interpreted as a phase condition in which two traveling signals in opposite directions compensate each other's phase shift, causing the product of the signals to be in-phase at all the nodes for the desired output frequency. This output frequency can be controlled by the input frequencies and the propagation velocity of the two inputs. According to an embodiment, this principle can be applied in order to use several nonlinear devices on a distributed line to realize a high-power frequency multiplier. FIG. 11 shows an implementation of such a system.

Referring to FIG. 11, a transmission line 110 carries both a first traveling signal 111 coming from the left and a second traveling signal 112 coming from the right. The sum of the two signals at each node are applied to the corresponding nonlinear device.

The upper part of FIG. 11 shows a power-combining structure 113 that can be used in accordance with an embodiment of the invention. According to one embodiment, the power-combining structure 113 includes an impedance transformer 114 ($L_2$ and $C_2$) at the frequency of interest (e.g., $2\omega_o$ or $4\omega_o$) and a transmission line network 115 that connects all of the outputs to the load 116.

Figure 12:
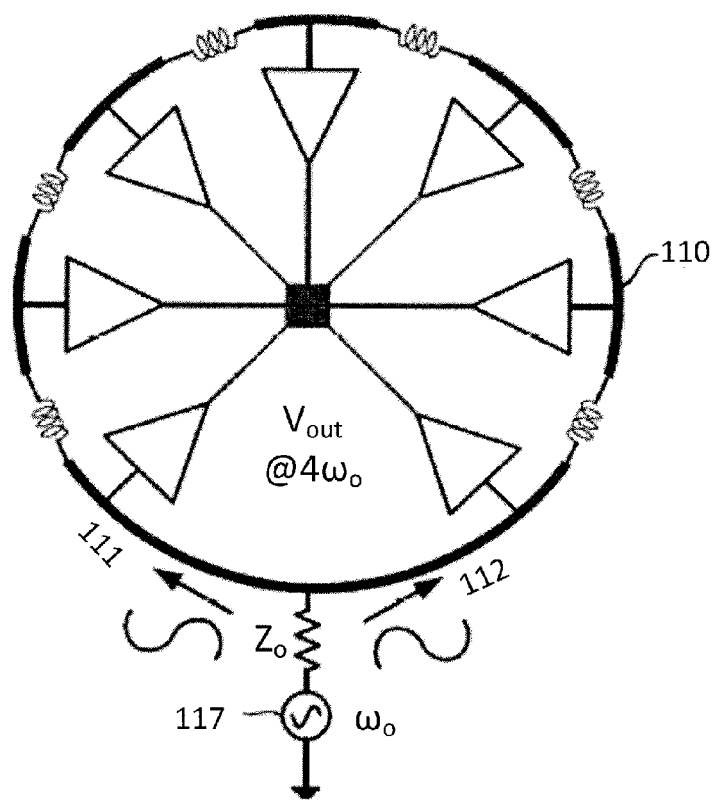
FIG. 12 shows an arrangement of the frequency multiplier of FIG. 11 using circular geometry in accordance with an embodiment of the invention.
Figure 14:
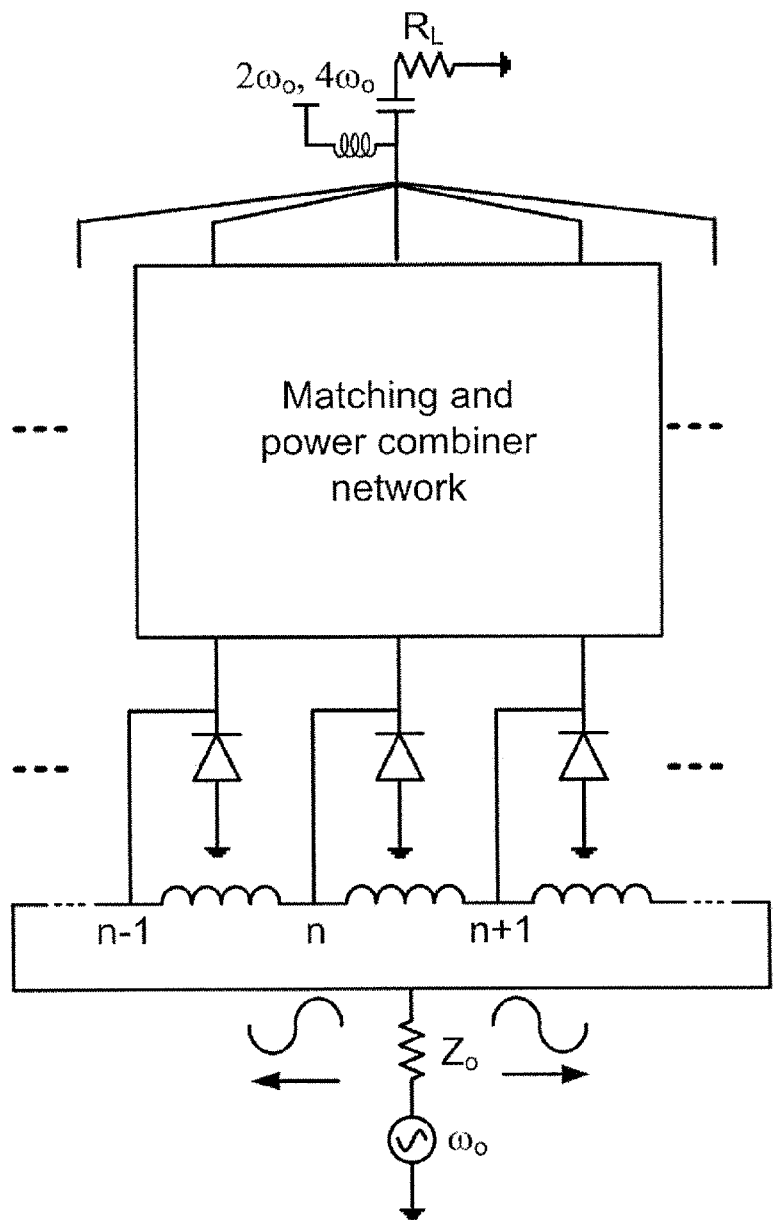
FIG. 14 shows a schematic of a Doppler-inspired frequency multiplier according to an embodiment of the invention.

In accordance with one embodiment of the invention, to ensure the same distance from each output to the load, a tree structure or a circular geometry can be used, as shown in FIG. 12. One advantage of the circular structure is that the circuit can be realized using only one input signal 117 that provides the first traveling signal 111 and the second traveling signal 112. By using one input signal, frequency matching between the two traveling waves can be easily accomplished. In addition, the circular structure provides a lower chip area for the circuit. Furthermore, the circular structure minimizes the length of the output power combiner to the output, which means lower loss at the high output frequency. Of course, embodiments are not limited to the circular structure. FIG. 14 shows another embodiment of a frequency multiplier where the nonlinear device is a diode. The layout for the circuit shown in FIG. 14 can be implemented using the circular geometry of FIG. 12. Although FIG. 14 illustrates a single input to provide the first traveling signal and the second traveling signal, embodiments are not limited thereto.

In operation, for the embodiment where the nonlinear device is a transistor, the sum of the two signals with different phase shifts (111 and 112) that travel the transmission line 110 is applied to the gates of the transistors $T_1$ at all nodes. Assuming the same frequency $\omega_o$ and amplitude A for the two traveling input signals (111 and 112), the voltage at node n becomes $$V_n(t) = A\cos(\omega_o t - k_1 n) + A\cos(\omega_o t - k_1(N-n) - \phi). \quad (17)$$

in which N is the number of sections, $\phi$ is the phase difference between the signal sources, and $k_1$ is the phase shift per section in the transmission line 110. The nonlinearity of the transistors can be modeled by $$I_{d_n}(t) = a_1 V_n(t) + a_2 V_n(t)^2 + a_3 V_n(t)^3 + \ldots, \quad (18)$$

where $I_{d_n}(t)$ is the n-th transistor drain current and the $a_k$s ($k \geq 2$) are the nonlinearity coefficients, which are usually a function of transistor bias point, input signal amplitude, and frequency. By substituting Equation 17 in Equation 18, it can be shown that, when the two inputs are at the same frequency, only even harmonics are added in-phase at the output. To illustrate this, the second term of Equation 18 is expanded as follows:

$$a_2 V_n(t)^2 = a_2 A^2 \cos^2(\omega_o t - k_1 n) + a_2 A^2 \cos^2(\omega_o t - k_1(N-n) - \phi) + \quad (19)$$
$$a_2 A^2 \cos(2\omega_o t - k_1 N - \phi) + a_2 A^2 \cos(k_1(N-2n) + \phi).$$

The third term on the right side of Equation 19 (shown at the bottom line of the equation) is the only term that has the same phase in all nodes (its phase is independent of the node number, n). Thus, the power of this $2\omega_o$ component can be added at each output node using a simple, low-loss power combiner. It is clear from Equation 19 that $\phi$, which is the phase difference between the sources, does not affect the in-phase power combining. However, it affects the standing-wave formation in the transmission line 110. The same exact structure can be used for other even harmonics, including the 4th harmonic. It is noteworthy to mention that if the frequency of one input is half that of the other, the odd harmonics can be added in-phase at the output.

EXAMPLE 4 design of 200 GHz and 400 GHz frequency multipliers.

Frequency multipliers at 200 GHz output frequency and 400 GFIz output frequency were designed in a 0.13 μm CMOS process. The input signal frequency was selected to be 100 GHz. In operation, the input signal can be provided by, for example, an on-chip oscillator or an off-chip signal source.

The 200 GHz multiplier was simulated using 4 and 8 sections, where a section is defined from a node and includes the transistor $T_1$ and power combining structure (here, the impedance transformer 114 of the capacitor $C_2$ and inductor $L_2$, and one transmission line of the transmission line network 115). The transmission line 110 wa s designed to have a 50Ω characteristic impedance to be matched to an external source. In addition, the cut-off frequency of the transmission line 110 was designed to be (much) higher than 100 GHz to minimize the loss and dispersion. The characteristic impedance $Z_o$ and the cut-off frequency $\omega_{cut}$ of the transmission line can be written as $$Z_o = \sqrt{\frac{L_1}{C_1}}, \omega_{out} = \frac{2}{\sqrt{L_1 C_1}}, \quad (20)$$

where $L_1$ is the inductance of each section and C1 is its capacitance, which is the transistor gate capacitance. For a constant $Z_o=50\Omega$, there is an optimum value for $L_1$ and $C_1$. In particular, if $C_1$ increases, the size of the transistor also increases, resulting in higher output power. But higher $C_1$ reduces the cut-off frequency, increasing the reflection and dispersion of the transmission line, resulting in lower output power. For a 4-stage, 200 GHz multiplier, the optimum values were simulated to be $L_1=50$ pH and $C_1=20$ fF, which corresponds to a transistor width of 20 μm. To match the output impedance of the transistors at 200 GHz to the load impedance of $R_L=50\Omega$, $L_2$ and $C_2$ were calculated to be 90 pH and 10 fF, respectively.

In accordance with one implementation of the invention, the inductors and capacitors are realized using micro-strip lines and metal-to-metal capacitors, respectively. These passive components were simulated in Sonnet electromagnetic simulator to extract the exact values and quality factors. Typical quality factors of a micro-strip inductor at 100 GHz and 200 GHz are 50 and 40, respectively. The quality factor of the metal-to-metal capacitor is around 100 at 200 GHz.

For the simulation, two equi-phase sources were used to generate a high-amplitude standing wave for all the nodes. The maximum power change at the output is around 2 dB when changes. The output power of the 4-stage multiplier at 200 GHz was −10 dBm given the 5 dBm input power at 100 GHz and 12 mw of DC power from a 1.5 V supply.

Figure 13:
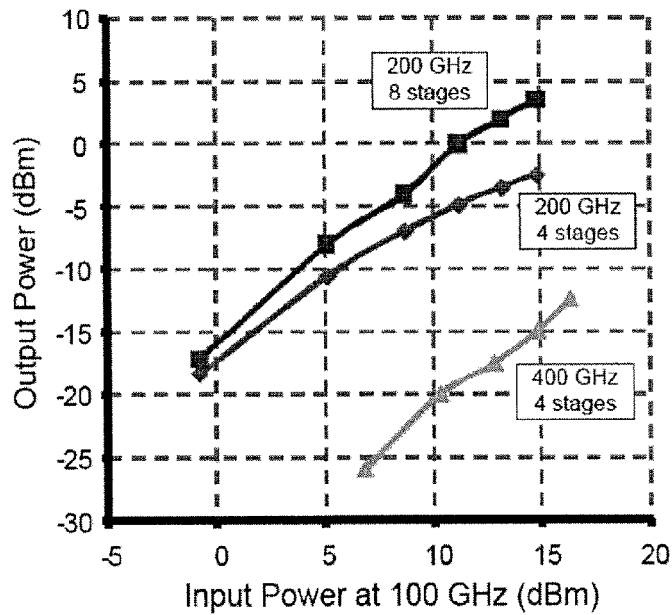
FIG. 13 is a plot of input power vs. output power at 200 GHz and 400 GHz for simulated frequency multipliers of certain embodiments of the invention.

Using the same methodology, an 8-stage 200 GHz and a 4-stage 400 GHz multipliers were designed. FIG. 13 shows the output power of the 4-stage 200 GHz output signal frequency multiplier, the 8-stage 200 GHz output signal frequency multiplier, and the 4-stage 400 GHz output signal frequency multiplier. These results were generated using Cadence Specter. An output power of 3.5 dBm and a conversion gain of −11 dB was achieved using the 8-stage, 200 GHz multiplier, which consumed 115 mW. The 400 GHz multiplier generated −12.5 dBm and had −29 dB of conversion gain, consuming 15.5 mW of DC power. According to the simulations, power levels of the subject CMOS-based Doppler-inspired frequency multiplier are significantly higher than other CMOS implemented circuit designs presently available. For example, the maximum reported powers in the CMOS process at this frequency range are −47 dBm at 410 GHz (see E. Seok and K. K. O, "A 410 GHz CMOS push-push oscillator with an on-chip patch antenna," Proc. Digest of Technical Papers, IEEE International Solid-State Circuits Conference ISSCC 2008, February 2008, pp. 472-473), −20 dBm at 192 GHz (sec C. Cao, E. Seok, and K. K. O, "192 GHz push-push VCO in 0.13 μm CMOS," Electronics Letters, vol. 42, Issue 4, pp. 208-210, 2006), and −1.5 dBm at 125 GHz (C. Mao, C. S. Nallani, S. Sankaran, E. Seok, and K. K. O, "125-GHz diode frequency doubler in 0.13 μm CMOS," IEEE J. Solid-State Circuits, vol. 44, no. 5, pp. 1531-1538, May 2009).

C. Sub-Harmonic Mixer Using Single Transmission Line

Figure 15:
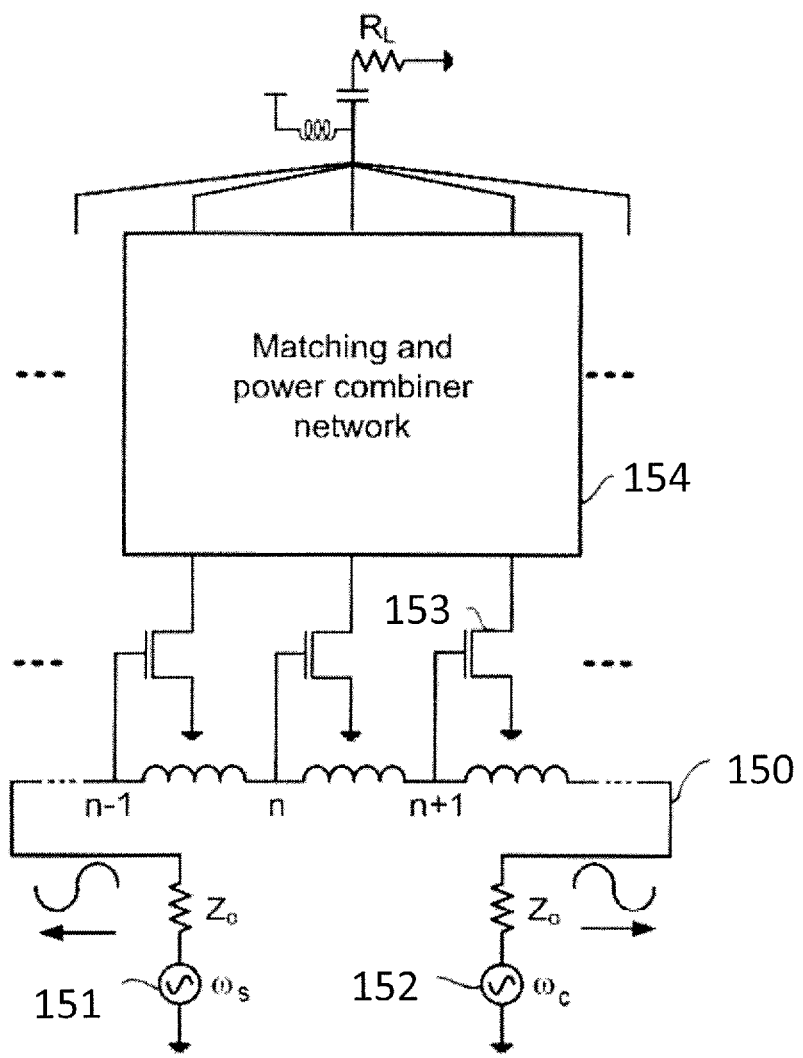
FIG. 15 shows a schematic of a Doppler-inspired mixer according to another embodiment of the invention.

Referring to FIG. 15, in accordance with an embodiment of the invention, a mixer can be implemented using a single transmission line for the two inputs. Similar to the frequency multiplier structure shown in FIG. 11, a transmission line 150 carries both a first traveling signal 151 coming from the left and a second traveling signal 152 coming from the right. The sum of the two signals at each node are applied to the corresponding nonlinear device (such as the transistor 153). Outputs of the nonlinear devices are combined using a matching and power combining network 154. In one embodiment, the matching and power combining network 154 can be the power-combining structure 113 shown in FIG. 11.

In operation, for the embodiment where the nonlinear device is a transistor, the sum of the two signals with different phase shifts (151 and 152) that travel the transmission line 150 is applied to the gates of the transistors $T_1$ at all nodes. Instead of using a signal having the same frequency, this mixer implementation utilizes signals having different frequencies.

EXAMPLE 5

Frequency Doubler

Figure 16:
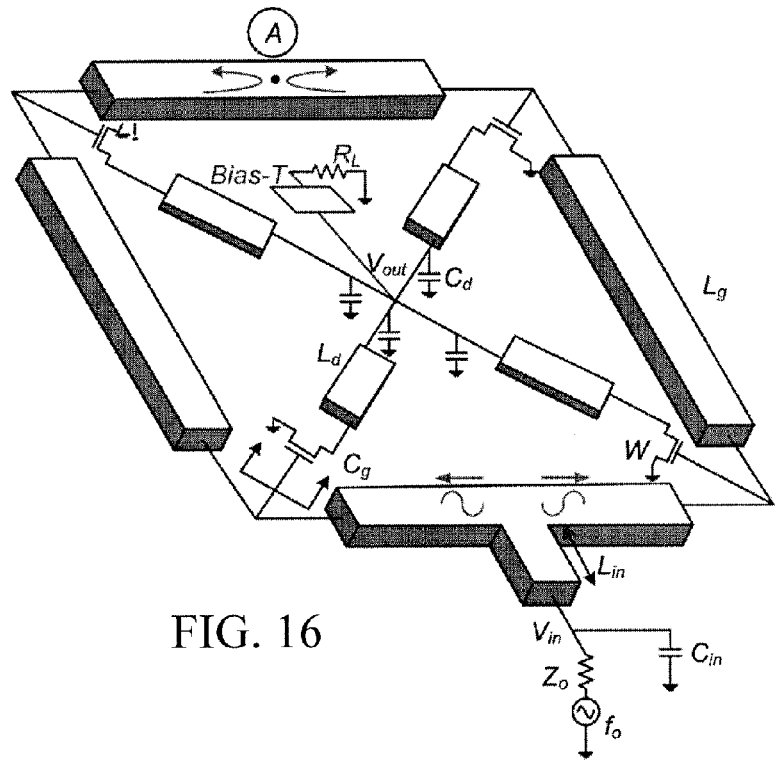
FIG. 16 shows a schematic of a frequency doubler in accordance with an embodiment of the invention.

FIG. 16 shows the schematic of a frequency doubler in accordance with an embodiment of the invention. As shown in FIG. 16, the input signal at $f_o$ can be applied to two parallel paths which are connected together at point "A". Each path can be viewed as a discrete transmission line of microstrip inductors ($L_g$) and input capacitance ($C_g$) of two transistors. Point "A" in FIG. 16 is the common mode node for the incident signal. Therefore, the signal can be understood to reflect back into the transmission lines from this point. The sum of incident and reflected signals is applied to the gate of each transistor. Due to nonlinearity of the transistors the $2^{nd}$ harmonic signals at $2f_o$ are generated in the four branches. These $2f_o$ components are in phase from all four branches and hence add constructively at node $V_{out}$. The inductor $L_d$ and capacitor $C_d$ are used to match the transistor output to $R_L$ at $2f_o$. They also create an inductive load for the transistor at $f_o$ resulting in a negative real impedance at the input of the transistor in this frequency. This negative resistance partially cancels the loss of the input transmission lines and hence boosts the gate-source voltage amplitudes, resulting in stronger harmonic generation.

Figure 17:
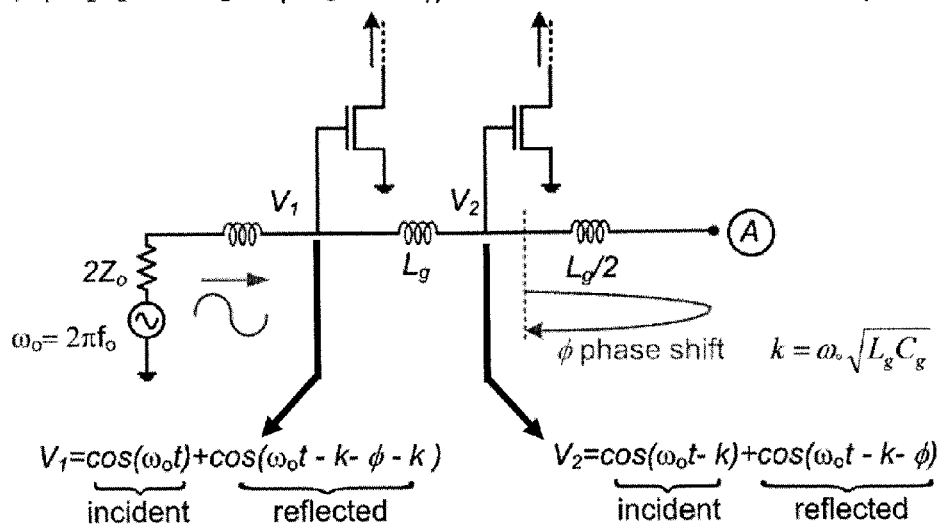
FIG. 17 shows a half circuit diagram of the input network of the frequency doubler of FIG. 16.

FIG. 17 illustrates the half circuit of the input network. The incident wave travels from the signal source and reflects back at point "A". Assuming a good matching at the input, the voltage at each transistor gate can be written as the sum of incident and reflected signals. For example, $V_1 = \cos(\omega_o t) + \cos(\omega_o t - k - \phi - k)$ and $V_2 = \cos(\omega_o t - k) + \cos(\omega_o t - k - \phi)$, where $\phi$ is the phase shift of the signal when it travels through the last inductor ($L_g/2$), and reflects back. Accordingly, the sum of the phases of the incident and reflected signals at both nodes $V_1$ and $V_2$ are equal to $2k+\phi$. For this reason, the $2^{nd}$ harmonic components at the output are in-phase from both transistors. The $1^{st}$ and $3^{rd}$ harmonic components are not in phase and partially cancel out at the output node. Since the operation principle of this doubler is not a function of the input frequency, its bandwidth is only limited to the bandwidths of the input and output matching networks.

Figure 18A:
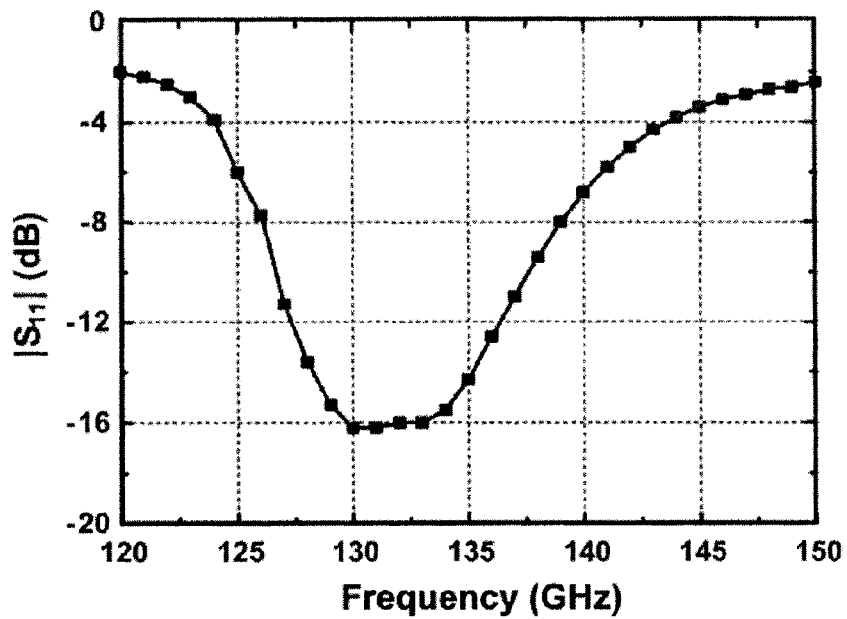
FIGS. 18A and 18B show plots of a simulated large signal input reflection coefficient ($S_{11}$) and output reflection coefficient ($S_{22}$), respectively, of the frequency doubler of FIG. 16.

For this embodiment example, the input is matched to a 50Ω source at $f_o$ using $C_{in}$, $L_{in}$, $L_g$ and $C_g$. To provide the wave propagation along the two parallel transmission lines, the cut-off frequency of the transmission lines is higher than the highest input frequency, which is around 140 GHz for this embodiment example. Because high input power is applied to the doubler for strong harmonic generation, the input matching is designed in large signal mode. FIG. 18A shows a plot of the simulated input reflection coefficient for an input power of 3 dBm. In this simulation $L_g$=50 pH and a transistor size of W=28 μm corresponding to $C_g$42 fF are used. These values result in a cut-off frequency of 220 GHz for the input transmission lines, which is well above the highest input frequency of 140 GHz for this embodiment example. The values of $L_g$ and $C_g$ are also selected to ensure that the amplitude of the generated standing wave at each gate is high enough for strong harmonic generation.

Figure 18B:
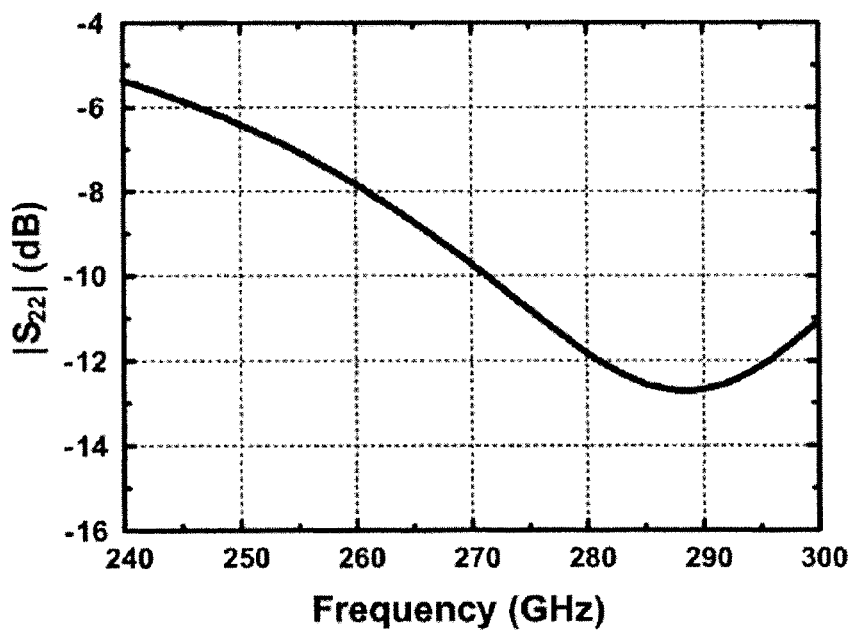

The output impedance is matched to a 50Ω load at $2f_o$ using $L_d$ and $C_d$. At the same time, $L_d$ and $C_d$ should form an inductive load for the transistor at $f_o$ so that the negative input resistance of the transistors cancels out part of the loss of the input transmission lines resulting in higher voltage swing. Optimum values for maximum output power in this embodiment example are found to be $L_d$=42 pH and $C_d$=8 fF. These values are also selected to inhibit the input network from oscillation. FIG. 18B shows the simulated output reflection coefficient.

Figure 19:
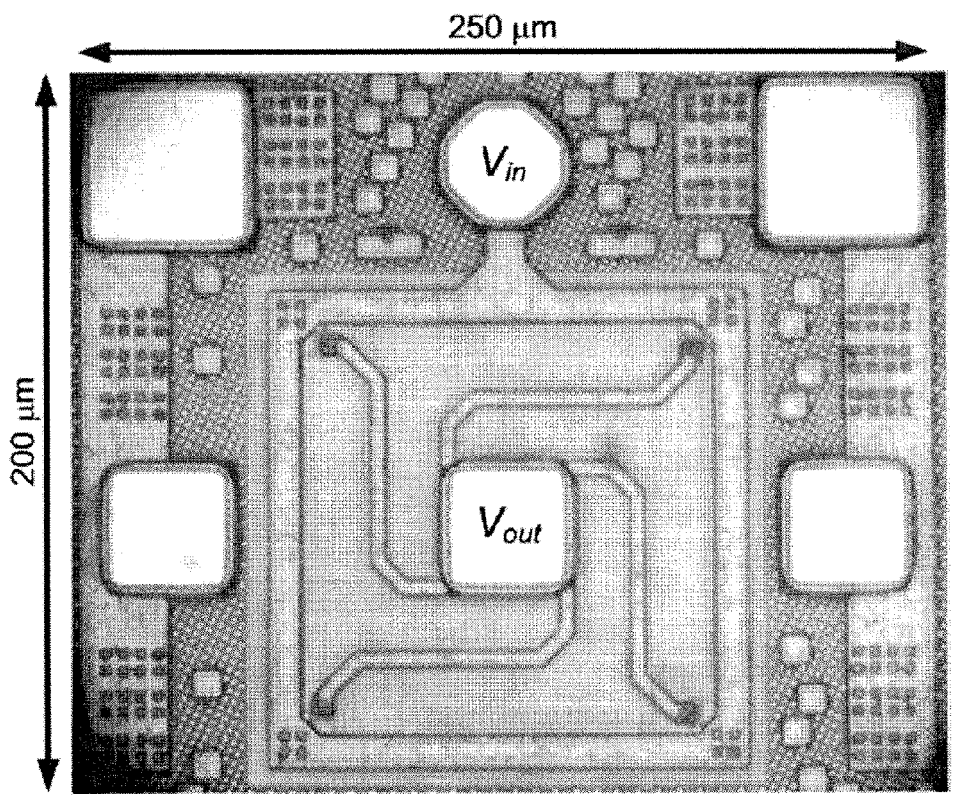
FIG. 19 shows a die photo of an experiment example frequency doubler according to an embodiment of the invention.

A 65 nm CMOS process with a top metal thickness of 1.3 μm was used to implement this circuit. FIG. 19 shows a die photo of the fabricated chip having a chip area of 200 μm×250 μm. For the embodiment example, all the inductors and capacitors are implemented using microstrip transmission lines and metal-to-metal capacitors of the pads, respectively. A Sonnet electromagnetic simulator was used to design all the passive components.

Figure 20:
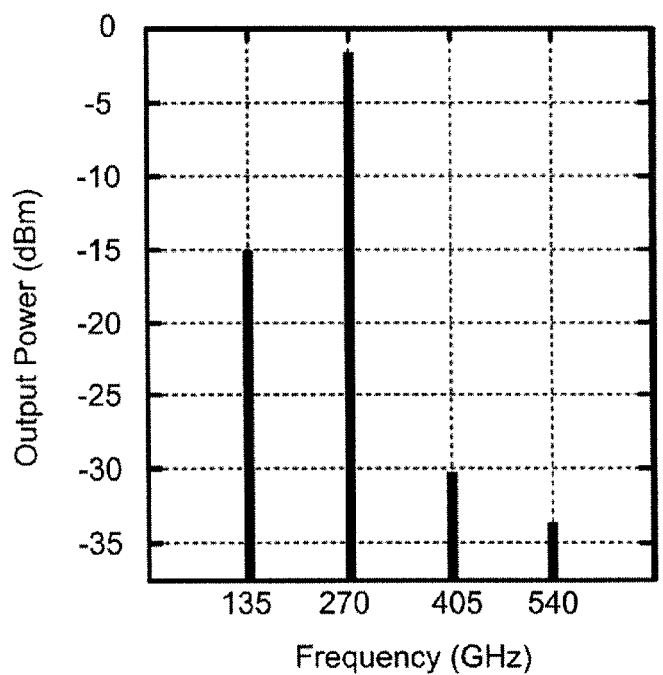
FIG. 20 shows a plot of simulated output spectrum of the frequency doubler of FIG. 16 with an input power of 5 dBm at an input frequency of 135 GHz.

Referring in part to FIG. 20, the simulations indicated a peak power of −2 dBm and a conversion loss of 7 dB at 270 GHz. The simulated output power is more than −8 dBm at all other frequencies from 250 GHz to 290 GHz for an input power of 5 dBm. Other harmonics are at least 13 dB lower than the $2^{nd}$ harmonic at 270 GHz.

Figure 21:
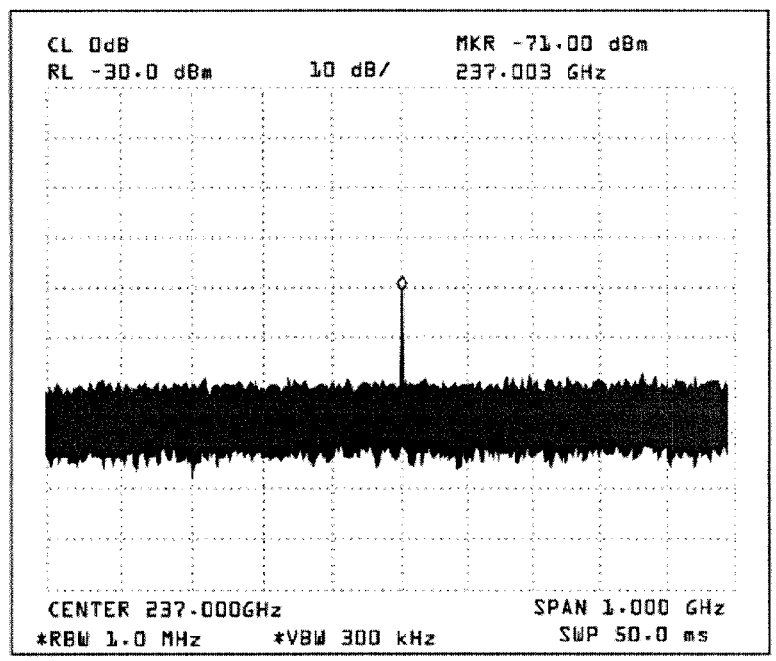
FIG. 21 shows a measured output spectrum with the 48$^{th}$ harmonic of the LO frequency with an input power of 4.5 dBm at an input frequency of 118.5 GHz.

Measurements were obtained from the fabricated chip using a GGB 140-GSG probe and a Cascade i325-GSG probe with built in bias-tees to probe the input and output signals, respectively. The frequency measurements were taken using an OML WR-3.0 harmonic mixer. With no input signal, no output signal was detected. As the input power reached −7.4 dBm the output power became detectable. By sweeping the LO frequency and observing the IF, the LO harmonic number and the signal frequency can be calculated. The detectable output signals from 220 GHz to 275 GHz were measured to be two times the input signal frequencies. The measurement setup was limited to the range of 220 GHz to 280 GHz because of the lower and higher cut-off frequency of the WR-3.0 and the WR-8.0 waveguides used with the input and output probes, respectively. FIG. 21 shows a measured output spectrum with the $48^{th}$ harmonic of the LO frequency. For this spectrum, the input frequency was 118.5 GHz and the input power was 4.5 dBm. The loss caused by the probe and other components was calibrated using a network analyzer by Cascade, VDI, and OML. Using the conversion loss of the mixer and the loss of the waveguides, a measurement of 0 dBm for the peak power at 237 GHz was obtained.

Figure 22:
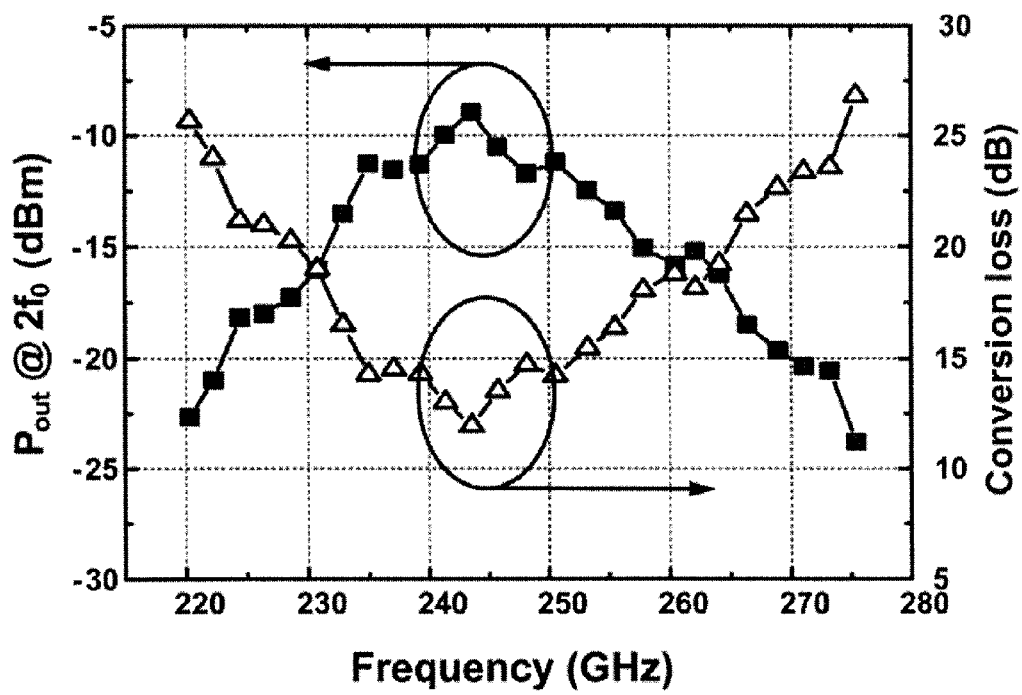
FIG. 22 shows measured output power and conversion loss as a function of output frequency.
Figure 23:
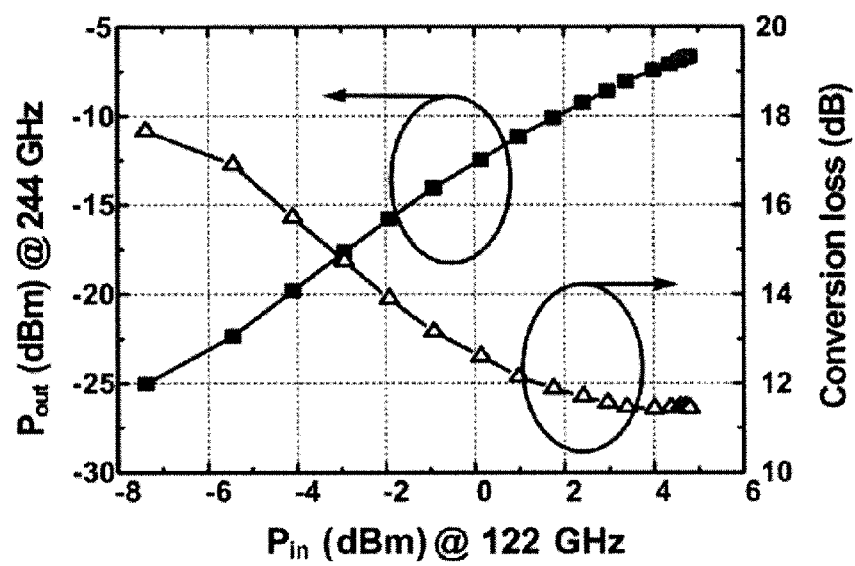
FIG. 23 shows a plot of measured output power and conversion loss as a function of input power at 244 GHz.

Another measurement of the output power was obtained using an Erickson PM4 power meter. FIG. 22 shows the output power and the conversion loss as a function of the output frequency using the power meter. In this plot the input power was kept constant at 3 dBm for all frequencies. The input power level was the highest power generated by the test setup across the entire band. As shown in FIG. 22, the peak measured power and conversion gain using this setup occurs at 244 GHz. At higher and lower frequencies, input and output matching networks limit the output power. FIG. 23 shows the output power and conversion loss as a function of input power at 244 GHz. A peak output power of −6.6 dBm with a conversion loss of 11.4 dB is achieved at this frequency. It can be seen in FIG. 21 that the output power is not saturated and higher output power can be achieved by providing higher input power. The maximum input power that the experimental setup can provide at 122 GHz is 4.8 dBm. In addition, the circuit consumes 40 mW from a 1.2 V supply. The results obtained in the simulation indicate an improvement in bandwidth and output power in CMOS at this frequency range as compared to existing injection locking schemes, Schottky diode schemes, ×6 multiplier chain schemes and single transistor schemes of related frequency multipliers.

In accordance with various aspects of the invention, the following non-limiting embodiments of the invention are provided:

1. A Doppler-inspired high frequency generator, comprising: a first transmission line for a first signal from a first input, the first transmission line having a plurality of first nodes; a second transmission line for a second signal from a second input, the second transmission line having a plurality of second nodes; a plurality of switches, each switch connected to a corresponding one of the plurality of second nodes such that the second signal controls a switching operation of the plurality of switches, each switch further connected to a corresponding one of the plurality of first nodes; a signal combiner receiving the first signal according to the switching operation of the plurality of switches, wherein the first input of the first transmission line and the second input of the second transmission line are configured such that the first signal travels the first transmission line in an opposite direction as the second signal traveling the second transmission line.

2. The Doppler-inspired high frequency generator of embodiment 1, wherein the first transmission line comprises a first inductor having a value L between each adjacent first node of the plurality of first nodes, wherein the second transmission line comprises a second inductor having a value L' between each adjacent second node of the plurality of second nodes.

3. The Doppler-inspired high frequency generator of embodiment 2, wherein L and L' satisfy $$f_o = f_s\left(1 \pm \frac{\sqrt{LC}}{\sqrt{L'C'}}\right) + \frac{m}{\sqrt{L'C'}},$$

where $f_o$ is the frequency of an output of the signal combiner, $f_o$ is the frequency of the first signal, m is an integer number, C is the capacitance at each of the first nodes, and C' is the capacitance at each of the second nodes.

4. The Doppler-inspired high frequency generator of embodiment 1, wherein the Doppler-inspired high frequency generator is an up-converter mixer, wherein the first input is connected to receive a baseband signal as the first signal and the second input is connected to receive a local oscillator (LO) frequency signal as the second signal.

5. The Doppler-inspired high frequency generator of embodiment 1, further comprising a buffer connected between each switch and corresponding first node.

6. The Doppler-inspired high frequency generator of embodiment 5, wherein the buffer is a transistor having a gate connected at the corresponding first node.

7. The Doppler-inspired high frequency generator of embodiment 6, further comprising a first capacitor connected in parallel to the gate of the transistor and a source of the transistor.

8. The Doppler-inspired high frequency generator of embodiment 5, wherein each switch comprises a transistor connected to the second transmission line, wherein a gate of each transistor is connected to the corresponding one of the plurality of second nodes of the second transmission line.

9. The Doppler-inspired high frequency generator of embodiment 8, wherein each switch further comprises: a capacitor and inductor connected in series between an output of the buffer and the transistor.

10. The Doppler-inspired high frequency generator of embodiment 1, further comprising a buffer connected between the output of each switch and the signal combiner.

11. The Doppler-inspired high frequency generator of embodiment 1, wherein the signal combiner comprises an array of continuous transmission lines, each continuous transmission line connected to a corresponding output of the plurality of switches.

12. The Doppler-inspired high frequency generator of embodiment 1, wherein the first transmission line and the second transmission line are arranged as two concentric circular transmission lines, wherein the signal combiner is located at a center of the two concentric circular transmission lines.

13. A Doppler-inspired high frequency generator, comprising: a first transmission line; a plurality of nonlinear devices connected to a corresponding plurality of nodes of the first transmission line, wherein the plurality of nonlinear devices receive a sum of two signals having different phase shifts traveling the first transmission line, wherein the two signals having different phase shifts are provided by a first signal traveling the first transmission line in one direction and a second signal traveling the first transmission line in an opposite direction; and a power combiner connected to outputs of the plurality of nonlinear devices.

14. The Doppler-inspired high frequency generator of embodiment 13, wherein the transmission line comprises a single input node, wherein a single input signal applied to the single input node provides the first signal and the second signal.

15. The Doppler-inspired high frequency generator of embodiment 13, wherein the transmission line comprises a first input node at one end of the transmission line and a second input node at the other end of the transmission line, wherein a first input signal applied to the first input node provides the first signal and a second input signal applied to the second input node provides the second signal.

16. The Doppler-inspired high frequency generator of embodiment 13, wherein the power combiner comprises: an impedance transformer connected to each nonlinear device of the plurality of nonlinear devices; and a transmission line network connecting outputs from the impedance transformer connected to each nonlinear device to a load.

17. The Doppler-inspired high frequency generator of embodiment 13, wherein the plurality of nonlinear devices comprise transistors, wherein the gate of each transistor is connected to the corresponding node of the first transmission line such that the gate of each transistor receives the sum of the two signals having the different phase shifts traveling the first transmission line.

18. The Doppler-inspired high frequency generator of embodiment 17, wherein the transistors are CMOS transistors, HEMTs, or HBTs.

19. The Doppler-inspired high frequency generator of embodiment 13, wherein the plurality of nonlinear devices comprise diodes, wherein one input of each diode is connected to the corresponding node of the first transmission line such that the one input of each diode receives the sum of the two signals having the different phase shifts traveling the first transmission line.

20. A method of high frequency signal generation from a lower frequency signal source, the method comprising: applying a first signal to a first transmission line at a first input, the first transmission line having a plurality of first nodes; applying a second signal to a second transmission line at a second input, the second transmission line having a plurality of second nodes; sampling the first signal using a plurality of switches, wherein: each switch is connected to a corresponding one of the plurality of second nodes such that the second signal controls a switching operation of the plurality of switches, each switch is further connected to a corresponding one of the plurality of first nodes, and the first signal is propagated along the first transmission line in a first direction and the second signal is propagated along the second transmission line in a second direction opposite the first direction such that the second signal controls a switching operation of a switch connected to a first node located farthest from the first input of the first transmission line before controlling a switching operation of another switch connected to a first node located closer to the first input; and combining the sampled first signals output from the plurality of switches.

21. The method of embodiment 20, wherein the plurality of switches comprises CMOS transistors, group III-IV heterojunction bipolar transistors (HBTs), or high electron mobility transistors (HEMTs).

22. The method of embodiment 20, wherein combining the sampled first signals output from the plurality of switches comprises using a signal combiner comprising an array of continuous transmission lines, each continuous transmission line connected to a corresponding output of the plurality of switches.

23. A method of high frequency signal generation from a lower frequency signal source, the method comprising: applying a first signal and a second signal to a first transmission line such that a sum of the first signal and the second signal is applied to each of a plurality of nonlinear devices connected to corresponding nodes along the first transmission line, wherein the first signal propagates in a first direction along the first transmission line and the second signal propagates in a second direction along the first transmission line opposite the first direction; and combining signals output from the plurality of nonlinear devices using a power combiner connected to outputs of the plurality of nonlinear devices 24. The method of embodiment 23, wherein applying the first signal and the second signal to the first transmission line comprises applying the first signal at a first input of the first transmission line and applying the second signal at a second input of the first transmission line.

25. The method of embodiment 24, wherein the first signal and the second signal have substantially the same frequency, the sum applied to each of the plurality of nonlinear devices being of the first signal at one phase shift and the second signal at a different phase shift.

26. The method of embodiment 24, wherein the first signal and the second signal are at different frequencies.

27. The method of embodiment 23, wherein applying the first signal and the second signal to the first transmission line comprises applying a single input signal to a first input of the first transmission line.

28. The method of embodiment 23, wherein combining the signals output from the plurality of nonlinear devices comprises adding in-phase power at each output of the plurality of non-linear devices.

29. The method of embodiment 23, wherein the power combiner comprises a plurality of transmission lines, each transmission line connected to a corresponding output of the plurality of non-linear devices.

30. The method of embodiment 23, wherein the plurality of nonlinear devices comprises CMOS transistors.

31. The method of embodiment 23, wherein the plurality of nonlinear devices comprises Schottky diodes.

32. The method of embodiment 23, wherein the plurality of nonlinear devices comprises group III-IV heterojunction bipolar transistors (HBTs) or high electron mobility transistors (HEMTs).

In accordance with embodiments of the invention, the change of frequency that occurs when a source and an observer move relative to each other is adopted to the electrical domain to generate or up-convert signals. Advantageously, certain embodiments of the invention effectively combine the outputs of several signal sources by controlling a wave's frequency and its propagation medium. According to certain embodiments of the invention, the outputs of the combined signal sources are in-phase at the desired frequency, which can be in mm-wave or terahertz range. This phase-matched property enables the output powers to be combined using very-short, low-loss transmission lines. Two examples of this technique were designed for a sub-harmonic up-converter and a terahertz multiplier. The up-converter mixer was implemented in a conventional CMOS process to verify the theory and simulation results. Based upon the simulations for the terahertz multiplier, the terahertz multiplier can generate more power than the existing methods in CMOS.

A greater understanding of the present invention and of its many advantages may be had from the aforementioned examples, given by way of illustration. The aforementioned examples are illustrative of some of the methods, applications, embodiments and variants of the present invention. They are, of course, not to be considered in any way limitative of the invention. Numerous changes and modifications can be made with respect to the invention.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to utilize or combine such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

We claim:

1. A Doppler-inspired high frequency generator, comprising:
a first transmission line for a first signal from a first input, the first transmission line having a plurality of first nodes;
a second transmission line for a second signal from a second input, the second transmission line having a plurality of second nodes;
a plurality of switches, each switch connected to a corresponding one of the plurality of second nodes such that the second signal controls a switching operation of the plurality of switches, each switch further connected to a corresponding one of the plurality of first nodes; and
a signal combiner receiving the first signal according to the switching operation of the plurality of switches,
wherein the first input of the first transmission line and the second input of the second transmission line are configured such that the first signal travels the first transmission line in an opposite direction as the second signal traveling the second transmission line.

2. The Doppler-inspired high frequency generator according to claim 1, wherein the first transmission line comprises a first inductor having a value L between each adjacent first node of the plurality of first nodes, wherein the second transmission line comprises a second inductor having a value L' between each adjacent second node of the plurality of second nodes.

3. The Doppler-inspired high frequency generator according to claim 2, wherein L and L' satisfy $$f_o = f_s\left(1 \pm \frac{\sqrt{LC}}{\sqrt{L'C'}}\right) + \frac{m}{\sqrt{L'C'}},$$

where $f_o$ is the frequency of an output of the signal combiner, $f_s$ is the frequency of the first signal, m is an integer number, C is the capacitance at each of the first nodes, and C' is the capacitance at each of the second nodes.

4. The Doppler-inspired high frequency generator according to claim 1, wherein the Doppler-inspired high frequency generator is an up-converter mixer, wherein the first input is connected to receive a baseband signal as the first signal and the second input is connected to receive a local oscillator (LO) frequency signal as the second signal.

5. The Doppler-inspired high frequency generator according to claim 1, further comprising a buffer connected between each switch and corresponding first node.

6. The Doppler-inspired high frequency generator according to claim 1, further comprising a buffer connected between the output of each switch and the signal combiner.

7. The Doppler-inspired high frequency generator according to claim 1, wherein the signal combiner comprises an array of continuous transmission lines, each continuous transmission line connected to a corresponding output of the plurality of switches.

8. The Doppler-inspired high frequency generator according to claim 1, wherein the first transmission line and the second transmission line are arranged as two concentric circular transmission lines, wherein the signal combiner is located at a center of the two concentric circular transmission lines.

9. A method of high frequency signal generation from a lower frequency signal source, the method comprising:
applying a first signal to a first transmission line at a first input, the first transmission line having a plurality of first nodes;
applying a second signal to a second transmission line at a second input, the second transmission line having a plurality of second nodes;
sampling the first signal using a plurality of switches, wherein:
each switch is connected to a corresponding one of the plurality of second nodes such that the second signal controls a switching operation of the plurality of switches,
each switch is further connected to a corresponding one of the plurality of first nodes, and
the first signal is propagated along the first transmission line in a first direction and the second signal is propagated along the second transmission line in a second direction opposite the first direction such that the second signal controls a switching operation of a switch connected to a first node located farthest from the first input of the first transmission line before controlling a switching operation of another switch connected to a first node located closer to the first input; and
combining the sampled first signals output from the plurality of switches.

10. The method according to claim 9, wherein combining the sampled first signals output from the plurality of switches comprises using a signal combiner comprising an array of continuous transmission lines, each continuous transmission line connected to a corresponding output of the plurality of switches.

11. A method of high frequency signal generation from a lower frequency signal source, the method comprising:
applying a first signal and a second signal to a first transmission line such that a sum of the first signal and the second signal is applied to each of a plurality of nonlinear devices connected to corresponding nodes along the first transmission line, wherein the first signal propagates in a first direction along the first transmission line and the second signal propagates in a second direction along the first transmission line opposite the first direction; and
combining signals output from the plurality of nonlinear devices using a power combiner connected to outputs of the plurality of nonlinear devices.

12. The method according to claim 11, wherein applying the first signal and the second signal to the first transmission line comprises applying the first signal at a first input of the first transmission line and applying the second signal at a second input of the first transmission line.

13. The method according to claim 12, wherein the first signal and the second signal have substantially the same frequency, the sum applied to each of the plurality of nonlinear devices being of the first signal at one phase shift and the second signal at a different phase shift.

14. The method according to claim 12, wherein the first signal and the second signal are at different frequencies.

15. The method according to claim 11, wherein applying the first signal and the second signal to the first transmission line comprises applying a single input signal to a first input of the first transmission line.

16. A Doppler-inspired high frequency generator, comprising:
a first transmission line;
a plurality of nonlinear devices connected to a corresponding plurality of nodes of the first transmission line, wherein the plurality of nonlinear devices receive a sum of two signals having different phase shifts traveling the first transmission line, wherein the two signals having different phase shifts are provided by a first signal traveling the first transmission line in one direction and a second signal traveling the first transmission line in an opposite direction; and
a power combiner connected to outputs of the plurality of nonlinear devices.

17. The Doppler-inspired high frequency generator according to claim 16, wherein the transmission line comprises a single input node,
wherein a single input signal applied to the single input node provides the first signal and the second signal.

18. The Doppler-inspired high frequency generator according to claim 16, wherein the transmission line comprises a first input node at one end of the transmission line and a second input node at the other end of the transmission line,
wherein a first input signal applied to the first input node provides the first signal and a second input signal applied to the second input node provides the second signal.

19. The Doppler-inspired high frequency generator according to claim 16, wherein the power combiner comprises:
an impedance transformer connected to each nonlinear device of the plurality of nonlinear devices; and
a transmission line network connecting outputs from the impedance transformer connected to each nonlinear device to a load.

20. The Doppler-inspired high frequency generator according to claim 16, wherein the plurality of nonlinear devices comprise transistors, wherein the gate of each transistor is connected to the corresponding node of the first transmission line such that the gate of each transistor receives the sum of the two signals having the different phase shifts traveling the first transmission line.

21. The Doppler-inspired high frequency generator according to claim 16, wherein the plurality of nonlinear devices comprise diodes, wherein one input of each diode is connected to the corresponding node of the first transmission line such that the one input of each diode receives the sum of the two signals having the different phase shifts traveling the first transmission line.

* * * * *

UNITED STATES PATENT AND TRADEMARK OFFICE
CERTIFICATE OF CORRECTION

PATENT NO. : 8,466,832 B2
APPLICATION NO. : 12/892210
DATED : June 18, 2013
INVENTOR(S) : Ehsan Afshari and Omeed Momeni It is certified that error appears in the above-identified patent and that said Letters Patent is hereby corrected as shown below:

In the Specification

Column 2,
Lines 34-35, "Sin c function" should read --*Sinc* function--.
Lines 54-55, "up-converter of FIG. 7. FIG. 10 is a plot"
  should read --up-converter of Figure 7.
            Figure 10 is a plot--.

Column 5,
Line 39-40, "multiple Sin c functions" should read --multiple *Sinc* functions--.
Line 42, "Sin c functions" should read --*Sinc* functions--.
Line 44, "Sin c function" should read --*Sinc* function--.
Line 45, "Sin c function" should read --*Sinc* function--.
Line 55, "in which in is" should read --in which *m* is--.

Column 6,
Line 24, "Sine function" should read --*Sinc* function--.
Line 43, "Sin c function" should read --*Sinc* function--.
Line 46, "Sine function" should read --*Sinc* function--.

Column 7,
Line 27, "1 = 1" should read --l = 1--.
Line 30, "Sin c function" should read --*Sinc* function--.
Line 41, "for in in" should read --for *m* in--.

Column 8,
Line 4, "factor in in" should read --factor m in--.

Signed and Sealed this
Third Day of December, 2013

Margaret A. Focarino
*Commissioner for Patents of the United States Patent and Trademark Office*

CERTIFICATE OF CORRECTION (continued)
U.S. Pat. No. 8,466,832 B2

Column 13,
Line 10, "400 GFIz" should read --400 GHz--.
Line 57, "when changes" should read --when $\Phi$ changes--.
Line 66, "Cadence Specter" should read --Cadence Spectre--.